United States Patent [19]

Gofuku

[11] Patent Number: 5,767,560
[45] Date of Patent: Jun. 16, 1998

[54] PHOTOELECTRIC CONVERSION DEVICE AND METHOD OF DRIVING THE SAME

[75] Inventor: Ihachiro Gofuku, Atsugi, Japan

[73] Assignee: Canon Kabushiki Kaisha, Tokyo, Japan

[21] Appl. No.: 352,688

[22] Filed: Nov. 30, 1994

Related U.S. Application Data

[63] Continuation of Ser. No. 978,887, Nov. 19, 1992, abandoned.

[30] Foreign Application Priority Data

| Nov. 22, 1991 | [JP] | Japan | 3-332785 |
| Nov. 22, 1991 | [JP] | Japan | 3-332786 |
| Nov. 22, 1991 | [JP] | Japan | 3-332787 |

[51] Int. Cl.$^6$ .................... H01L 31/107; H01L 31/072
[52] U.S. Cl. .................... 257/438; 257/185; 257/186; 257/187; 257/444
[58] Field of Search .................... 257/431, 438, 257/444, 292, 186, 187, 184, 185, 188, 189; 250/214 R

[56] References Cited

U.S. PATENT DOCUMENTS

| 4,476,477 | 10/1984 | Capasso et al. | 257/186 |
| 4,791,469 | 12/1988 | Ohmi et al. | 257/462 |
| 4,886,977 | 12/1989 | Gofuku et al. | |
| 4,933,731 | 6/1990 | Kimura | 257/444 |
| 5,019,887 | 5/1991 | Niwa et al. | |
| 5,084,747 | 1/1992 | Miyawaki | 257/432 |
| 5,155,351 | 10/1992 | Yamanobe et al. | |

FOREIGN PATENT DOCUMENTS

| 087299 | 8/1983 | European Pat. Off. | H01L 31/10 |
| 444963 | 9/1991 | European Pat. Off. | H01L 31/07 |
| 58-157179 | 9/1983 | Japan | |
| WO 9102381 | 2/1991 | WIPO | |

OTHER PUBLICATIONS

Sze, *Physics of Semiconductor Devices*, 1981, p. 122.

Ripamonti et al., "Realization of a Staircase Photodiode: Towards a Solid–State Photomultiplier", 2107a *Nuclear Instruments & Methods in Physics Research A*, A288 (Mar. 1, 1990), pp. 99–103.

*Primary Examiner*—Mahshid D. Saadat
*Assistant Examiner*—Alice W. Tang
*Attorney, Agent, or Firm*—Fitzpatrick, Cella, Harper & Scinto

[57] ABSTRACT

A photoelectric conversion device including: a photoelectric conversion portion having a light absorbing layer disposed between charge injection inhibition layers and having a predetermined forbidden band width $Eg_1$, and a carrier multiplication portion including a single or a plurality of inclined band gap layers, the inclined band gap layer including a minimum forbidden band width $Eg_2$ and a maximum forbidden band width $Eg_3$ which are disposed to be in contact with each other to form a hetero junction and having, at the two ends thereof, forbidden band widths $Eg_4$ which holds a relationship $Eg_2<Eg_4<Eg_3$ in such a manner that the forbidden band width is continuously changed from the two forbidden band widths $Eg_2$ and $Eg_3$ to the forbidden band width $Eg_4$, and the energy step in a conductive band of the hetero junction portion is larger than the energy step in a valence electron band, wherein at least the minimum forbidden band width $Eg_2$ of portions which form the hetero junction is made of a high density p-type semiconductor.

16 Claims, 17 Drawing Sheets

ONE OF INCLINED ENERGY BAND GAPS

FIG. 6A
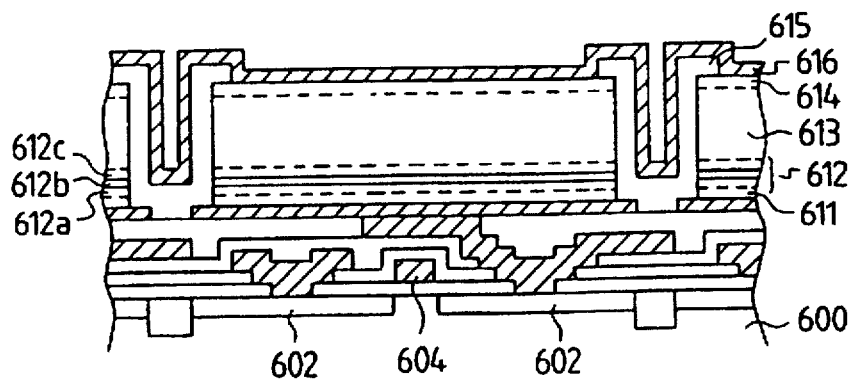
FIG. 6B
FIG. 6C
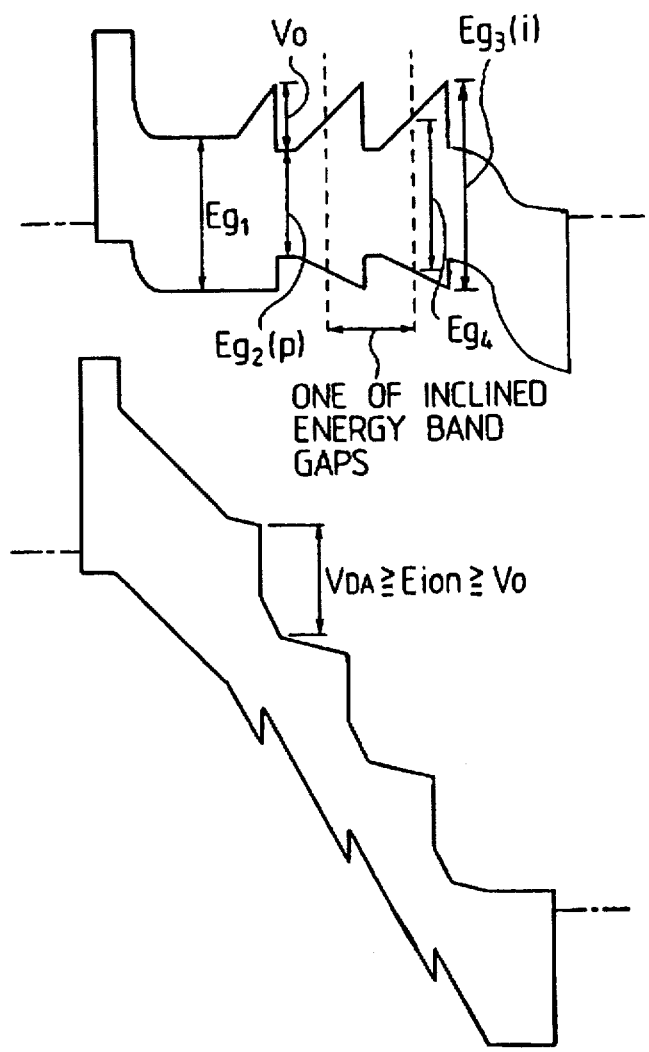

PHOTOELECTRIC CONVERSION DEVICE AND METHOD OF DRIVING THE SAME

This application is a continuation of application Ser. No. 07/978,887 filed Nov. 19, 1992, now abandoned.

BACKGROUND OF THE INVENTION

1. Field of the Invention

The present invention relates to a photoelectric conversion device and a method of driving the same, and, more particularly to a photoelectric conversion device and a method of driving the same which is capable of, at the time of performing an operation of storing charges into an avalanche photodiode (APD), lowering the driving voltage of the photoelectric conversion device while having Knee characteristics.

2. Related Background Art

Recently, an elongated line sensor comprising photosensors, which are one-dimensionally arranged, and an area sensor comprising the same which are two-dimensionally arranged, have been widely used with wide use of image information processing apparatuses such as facsimile machines, digital copying machines, image readers, and video cameras.

As the photoelectric conversion device for use in the aforesaid sensors, a solid-state image sensing device such as a CCD, a bipolar transistor, or a MOS-type solid-state image sensing device has been used. Recently, there is a desire of further improving the S/N ratio because the aperture ratio of the pixel has been lowered and noise of a signal charge transferring system has been enlarged due to the higher density mounting of the devices required with the improvement of the quality of images.

Under the aforesaid conditions, incident light has been used effectively by utilizing a spherical lens or by employing a structure in which a photoelectric conversion device made of a material such as amorphous silicon is stacked on a CCD or the like. However, a peculiar problem of the noise of the transfer system has remained unsolved.

An avalanche photodiode (APD) has been found to relatively eliminates the noise of the transfer system by amplifying the optical signal in a photoelectric conversion device (refer to "Shin-Gaku Giho" Vol. 86, No. 208, '86). The APDs are diodes which are widely used in the optical communication field and which are capable of amplifying the output to a degree of several tens to hundreds of times. If the APD can be applied to an image pickup device, it can be expected that the S/N ratio can be satisfactorily improved.

However, the fact that the method of driving the APD is considerably different from that of driving photoelectric conversion elements for use in ordinary image pickup devices such as Schottky devices PN and PIN devices has prevented the wide application of the APD to the image pickup devices.

Specifically, the ordinary APD for use in the optical communication field requires a considerably high voltage of several tens to hundreds of volts because avalanche multiplication is induced by acceleration of the electric field of the carrier which is realized by an application of high voltage between two terminals of the device, and therefore the APD is not a normal power source for driving a solid sate imaging device.

Furthermore, avalanche multiplication considerably depends upon the intensity of the electric field. This field has no region from which a linear output can be obtained with respect to the intensity of input light when the avalanche multiplication is utilized in a charge storage mode, which is an ordinary method of driving the solid-state image sensing device.

An improvement has been developed (ITEJ Technical Report Vol. 11, No. 28, pp67 to 72) which has an additional capacity provided for the charge storage portion so as to restrict the change of the electric field taking place due to the charge storage, so that the linearity of the input and that of the output are maintained. However, deterioration of the linearity of the input and the output cannot be perfectly prevented when the voltage of the output signal component has been changed, resulting in a remaining unsolved problem in that a high voltage power source must be used.

As a region in which the avalanche multiplication is taking place, there has been developed a structure arranged in such a manner that inclined band gaps are combined to each other and the carrier multiplication is enhanced in a hetero junction portion (refer to Japanese Patent Laid-Open No. 58-157179).

With the aforesaid method, the fact that energy required to ionize the carrier is supplied from the energy step present in the hetero junction portion will prevent the change of the multiplication ratio which takes place due to the change of the power supply voltage when the charge is stored. Furthermore, it is to apply to each of the inclined layers a voltage of 1 to 2 V multiplied by the number of inclined layers because the voltage to be applied to the multiplication layer can be reduced to a level which is able to deplete each of the inclined band gap layers. For example, it is sufficient to apply a voltage of 10V in the case where, for example, there are five inclined layers to each of which a voltage of 2V is added.

However, the aforesaid photoelectric conversion device cannot prevent the deterioration of the dynamic range depending upon the driving conditions such as the applied bias because it is designed for the purpose of mainly obtaining stable linearity of the input and the output, that is, even if the effective bias applied to the device has been changed during the charge storage operation, the carrier multiplication is not changed.

Accordingly, there has been an intention of realizing a photoelectric conversion device exhibiting a high sensitivity and a wide dynamic range and a method of driving it by giving a Knee characteristic in the charge storage operation by disposing a rich impurity layers in either or both sides of the hetero junction portion between the maximum band gap layer and the minimum band gap layer.

However, a problem arises in that the concept of driving a photoelectric conversion device with a low voltage cannot be realized if no means is employed which is able to minimize the rise of the applied voltage because the fact that the impurity rich layer is contained by a depletion layer will usually raise the voltage required for the depleting process. This problem will now be described briefly.

FIGS. 1A and 1B each illustrate an energy band which shows the structure of a conventional photoelectric conversion device disclosed in International Laid-Open No. WO91/02381. FIG. 1A illustrates an energy band realized when no bias is applied to an APD having, as the device structure, a carrier multiplication portion formed by three stages. Referring to the drawing, symbol $Eg_1$ represents a required forbidden band, $Eg_2$ represents a minimum forbidden band, and $Eg_3$ represents a maximum forbidden band. Symbol $V_0$ represents energy which is the difference $(x_2-x_3)$ between electron affinity $x_2$ of a material of $Eg_2$ and electron affinity $x_3$ of a material of $Eg_3$.

FIG. 1B illustrates an energy band realized when a bias required to cause a carrier multiplication to take place is applied. Referring to FIG. 1B, symbol $E_{ion}$ represents carrier ionizing energy, and $V_0$ represents energy which is the difference $(x_2-x_3)$ between electron affinity $x_2$ of a material of $Eg_2$ and electron affinity $x_3$ of a material of $Eg_3$. Symbol $V_{DA}$ represents energy obtained by adding an energy step, which corresponds to the accelerated electric field, to $V_0$, the aforesaid $V_{DA}$ having a relationship $V_{DA} \geq E_{ION} \geq V_0$.

FIG. 2 is a graph which illustrates characteristics between electric currents and voltages of an photoelectric conversion device of a type arranged as shown in FIG. 1B.

The structure shown in FIG. 1B is arranged in such a manner that the minimum forbidden band is subjected to a high density n-type doping because the band offset energy of the conductive zone of the hetero junction portion between the inclined band gap layers realized due to the carrier multiplication is lower than the energy for ionizing the minimum band gap portion, so that an electric field concentration is taken place when the bias is applied to the device in order to cause the electron ionization to take place.

However, it is necessary for the APD structured into a high-density n-type semiconductor by subjecting its minimum forbidden band to a high density n-type doping among the aforesaid conventional APD designed to utilize the electron multiplication to be additionally applied with voltages of about 20, 40 and 60V after an electric current, which corresponds to a quantum efficiency of 1 at 14 to 15V, starts passing until multiplications of 2, 4 and 8 times take place. The aforesaid voltage levels are high levels comparing to the voltage levels which have raised a problem to be solved by the conventional APD of the electric field acceleration type. Therefore, it can be said that the aforesaid requirement is of no practical use.

That is, the conventional photoelectric conversion device arranged in such a manner that the high density n-type semiconductor is disposed in the hetero junction portion between the maximum forbidden band layer and the minimum forbidden band layer for the purpose of preventing reduction of the dynamic range of the APD designed to utilize the electron multiplication and having a structure realized by repeating the inclined band gap layers encounters an unsolved problem that high voltage must be applied when it is driven.

FIG. 3A illustrates an energy band realized when no bias is applied to another APD having, as the device structure, a carrier multiplication portion composed of three stages, and FIG. 3B illustrates an energy band realized when a bias required for a carrier multiplication to take place. Referring to FIG. 3B, symbol $V_0$ represents energy which is the difference $(x_2-x_3)$ between electron affinity $x_2$ of a material of $Eg_2$ and electron affinity $x_3$ of a material of $Eg_3$, $V_D$ represents energy of the step of the conductive band of the hetero junction portion realized when the bias is applied, and $E_{ion}$ represents carrier ionizing energy, the aforesaid factors having a relationship $$V_D = V_0 \geq E_{ion}.$$

FIG. 4 is a graph which illustrates the characteristics of the APD shown in FIG. 3B between electric currents and voltages.

In the conventional example shown in FIG. 3B, the band offset energy of the hetero junction portion between the inclined band gap layers for the carrier multiplication exceeds the energy for ionizing the minimum band gap portion at the point of the zero bias. Therefore, all of the inclined band gap layers are substantially simultaneously depleted with the progress of the bias application to the device. If the voltage exceeds depleting voltage $V_{dep}$ as shown in FIG. 4, a large electric current, which corresponds to about a quantum efficiency of 8, starts passing rapidly.

FIG. 5 illustrates the relationship (solid line) between the input and the output from the conventional photoelectric conversion device realized when a charge is stored thereto and the relationship (dashed line) between the same of a device of a type having a quantum efficiency of 1. As can be understood from this graph, the device, on which APD is mounted, encounters the reduction of a saturated light quantity and the contraction of dynamic range although the sensitivity can be improved.

That is, a photoelectric conversion device designed for the purpose of mainly obtaining highly sensitive output and a method of driving the same encounter a problem in that the dynamic range is undesirably contracted.

SUMMARY OF THE INVENTION

An object of the present invention is provide a photoelectric conversion device which is capable of overcoming the aforesaid conventional problem, which is arranged to utilize multiplication of electrons, on which an APD having a structure formed by repeating inclined band gaps is mounted, which is capable of performing a storage operation while having Knee characteristics, and which can be driven by minimized voltage, and a method of driving the same.

Another object of the present invention is to provide a photoelectric conversion device capable of maintaining a wide dynamic range while preventing deterioration of the S/N ratio and a method of driving the same.

In order to achieve the aforesaid objects, according to one aspect of the present invention, there is provided a photoelectric conversion device comprising:

a photoelectric conversion portion having a light absorbing layer disposed between charge injection inhibition layers and having a predetermined forbidden band width $Eg_1$, and a carrier multiplication portion including a single or a plurality of inclined band gap layers, the inclined band gap layer including a minimum forbidden band width $Eg_2$ and a maximum forbidden band width $Eg_3$ which are disposed to be in contact with each other to form a hetero junction and having, at the two ends thereof, forbidden band widths $Eg_4$ which holds a relationship $Eg_2 < Eg_4 < Eg_3$ in such a manner that the forbidden band width is continuously changed from the two forbidden band widths $Eg_2$ and $Eg_3$ to the forbidden band width $Eg_4$, and the energy step in a conductive band of the hetero junction portion is larger than the energy step in a valence electron band, wherein at least the minimum forbidden band width $Eg_2$ of portions which form the hetero junction is made of a high density p-type semiconductor.

Practical driving conditions are realized by making bias voltage $V_V$ applied to the two ends of the light absorbing layer and the carrier multiplication portion of the photoelectric conversion device to be lower at the light absorbing layer than that applied to the carrier multiplication layer, and by determining its value as follows while assuming that the energy step of the conductive band in the hetero junction portion in which the forbidden band is discontinuously changed from the maximum value to the minimum value is $E_{C \: OFF}$, the thickness of the light absorbing layer is $d_P$, the thickness of the carrier multiplication layer is $d_A$, the thickness of one inclined band gap layer is $d_{GRD\ int}$, the thickness of one layer having the maximum forbidden band to which impurities are added to a high density is $d_{EG2\ dop}$, and number of hetero junction portions of a layer having the maximum forbidden band and a layer having the minimum forbidden band is n, $$V_V \geq \frac{d_P + d_A}{d_A} \cdot n \cdot E\{C\ OFF + n \cdot (n+1) \cdot \frac{d_{GRD\ int}}{d_{EG2\ dop}} \cdot (Eg_2 - E_{C\ OFF})$$

According to the present invention, the Knee characteristics can be realized in the charge storage operation and therefore the dynamic range can be widened by arranging the structure of the photoelectric conversion device, which is designed to utilize multiplication of electrons and on which an APD having a structure formed by repeating inclined band gaps is mounted, in such a manner that at least the minimum forbidden band width portion of the hetero junction portion of the minimum forbidden band width $Eg_2$ portion and the maximum forbidden band width $Eg_3$ portion is made to be a high density P-type semiconductor layer.

It can be driven by a lower voltage level in comparison to the conventional technology by making the bias $V_V$ to be applied to the device to be lower in the light absorbing layer than that in the carrier multiplication portion and by causing $V_V$ to meet the aforesaid equation. This fact will now be described in detail.

In order to prevent an undesirable rise of the applied voltage $V_V$, it is important to prevent an application of a large electric field to the thick light absorbing layer.

Assuming that electrons are multiplied, it is necessary to make the potential at the light absorbing layer to be lower than that at the carrier multiplication portion in order to cause electrons to flow from the light absorbing layer to the carrier multiplication portion. That is, it is necessary that negative voltage is applied to a terminal of the light absorbing layer. In this case, if the impurity layer is depleted by raising the voltage, the electric field is strengthened in the light absorbing layer in the case where the impurity is a donor, while the same is strengthened in the carrier multiplication portion in the case where the impurity is an accepter.

That is, the voltage which must be applied to the device can be lowered by making the impurity to be the accepter and by using p-type semiconductor because the electric field acting on the light absorbing layer can be reduced.

In order to estimate the degree of the video bias $V_V$ to be applied to the photoelectric conversion device according to the present invention, voltage to be applied to each layer is as follows:

In the following equations, symbols represent the following factors:

$E_{C\ OFF}$: energy step of the conductive band in the hetero junction portion in which the forbidden band is discontinuously changed from the maximum value to the minimum value $d_P$: thickness of light absorbing layer $d_A$: thickness of carrier multiplication layer $d_{GRD\ int}$: thickness of one inclined band gap layer $d_{EG2\ dop}$: thickness of one layer having the maximum forbidden band to which impurities are added to a high density n: number of hetero junction portions of a layer having the maximum forbidden band and a layer having the minimum forbidden band k: 1 to n, position of the impurity layer counted from the light absorbing layer $N_I$: density of impurity $E_g$: required forbidden band width $E_{g2}$: minimum forbidden band width $E_{g3}$: maximum forbidden band width $\epsilon$: dielectricity constant q: electricity quantity $V_V$: voltage to be applied to the device In the case where there are n impurity layers, voltage $V_{HK}$ to be applied to each layer when the impurity layer approximating the light absorbing layer is expressed by:

$$V_{HK} = \frac{(2k-1) \cdot q}{2\epsilon} \cdot N_I \cdot d_{EG2\ dop}^2 \tag{1}$$

The electric field intensity $E_{DK}$ acting at the end of each impurity layer is expressed by:

$$E_{DK} = \frac{k \cdot q}{\epsilon} \cdot N_I \cdot d_{EG2\ dp}$$

Since also the aforesaid electric field is applied to the k-th inclined band gap layer, the voltage $V_{AI}$ to be applied to all of the inclined band gap layer is expressed by:

$$V_{AI} = \frac{n \cdot (n+1)}{2} \cdot \frac{q}{\epsilon} \cdot N_I \cdot d_{EG2\ dop} \cdot d_{GRD\ int} \tag{2}$$

The impurity density $N_I$ is set by the following equation:

$$N_I = \frac{2\epsilon}{q} \cdot \frac{Eg_2 - E_{C\ OFF}}{d_{EG3\ dop}^2}$$

Assuming that the voltage required to deplete the inclined gap layer is superposed prior to the depletion of the impurity layer, the voltage corresponding to the superposed portion can be obtained as follows:

The voltage $V_{AI}$ DEP for the multiplication layer is given by:

$$V_{AI\ DEP} = n \cdot E_{C\ OFF}$$

The voltage $V_{P\ DEP}$ to be distributed to the light absorbing layer is given by:

$$V_{P\ DEP} = V_{AI\ DEP} \cdot (d_P/d_A)$$

Therefore, overall voltage $V_{DEP}$ is given by:

$$V_{DEP} = n \cdot E_{C\ OFF} \cdot ((d_P + d_A)/d_A) \tag{3}$$

As a result, the voltage $V_V$ to be applied to the device is the sum of (1), (2) and (3). However, it can be considered that the portion of (1) is small. A value given from the following equation may be added to obtain the minimum driving voltage:

$$V_V \geq \frac{d_P + d_A}{d_A} \cdot n \cdot E\{C\ OFF + n \cdot (n+1) \cdot \frac{d_{GRD\ int}}{d_{EG2\ dop}} \cdot (Eg_2 - E_{C\ OFF}) \tag{4}$$

Therefore, a photoelectric conversion device which has the Knee characteristics in the charge storage operation and which can be driven by a low voltage can be provided.

In order to achieve the aforesaid object, according to one aspect of the present invention, there is provided a photoelectric conversion device comprising:

a photoelectric conversion portion having a light absorbing layer disposed between charge injection inhibition layers and having a predetermined forbidden band width $Eg_1$, and a carrier multiplication portion including a single or a plurality of inclined band gap layers, the inclined band gap layer including a minimum forbidden band width $Eg_2$ and a maximum forbidden band width $Eg_3$ which are disposed to be in contact with each other to form a hetero junction and having, at the two ends thereof, forbidden band widths $Eg_4$ which holds a relationship $Eg_2 < Eg_4 < Eg_3$ in such a manner that the forbidden band width is continuously changed from the two forbidden band widths $Eg_2$ and $Eg_3$ to the forbidden band width $Eg_4$, and the energy step in a valence band of the hetero junction portion is larger than the energy step in a conduction band, wherein at least the minimum forbidden band width $Eg_2$ of portions which form the hetero junction is made of a high density n-type semiconductor.

Practical driving conditions are realized by making bias voltage $V_V$ applied to the two ends of the light absorbing layer and the carrier multiplication portion of the photoelectric conversion device to be higher at the light absorbing layer than that applied to the carrier multiplication layer, and by determining its value as follows while assuming that the energy step of the valence band in the hetero junction portion in which the forbidden band is discontinuously changed from the maximum value to the minimum value is $E_{V\,OFF}$, the thickness of the light absorbing layer is $d_P$, the thickness of the carrier multiplication layer is $d_A$, the thickness of one inclined band gap layer is $d_{GRD\,int}$, the thickness of one layer having the maximum forbidden band to which impurities are added to a high density is $d_{EG2\,dop}$, and number of hetero junction portions of a layer having the maximum forbidden band and a layer having the minimum forbidden band is n, $$V_V \geq \frac{d_P + d_A}{d_A} \cdot n \cdot E\{V\,OFF + n \cdot (n+1) \cdot \frac{d_{GRD\,int}}{d_{EG2\,dop}} \cdot (Eg_2 - E_{V\,OFF})$$

According to the present invention, the Knee characteristics can be realized in the charge storage operation and therefore the dynamic range can be widened by arranging the structure of the photo-electric conversion device, which is designed to utilize multiplication of positive holes and on which an APD having a structure formed by repeating inclined band gaps is mounted, in such a manner that at least the minimum forbidden band width portion of the hetero junction portion of the minimum forbidden band width $Eg_2$ portion and the maximum forbidden band width $Eg_3$ portion is made to be a high density n-type semiconductor layer.

It can be driven by a lower voltage level in comparison to the conventional technology by making the bias $V_V$ to be applied to the device to be higher in the light absorbing layer than that in the carrier multiplication portion and by causing $V_V$ to meet the aforesaid equation. This fact will now be described in detail.

In order to prevent an undesirable rise of the applied voltage $V_V$, it is important to prevent an application of a large electric field to the thick light absorbing layer.

Assuming that positive holes are multiplied, it is necessary to make the potential at the light absorbing layer to be higher than that at the carrier multiplication portion in order to cause positive holes to flow from the light absorbing layer to the carrier multiplication portion. That is, it is necessary that positive voltage is applied to a terminal of the light absorbing layer. In this case, if the impurity layer is depleted by raising the voltage, the electric field is strengthened in the light absorbing layer in the case where the impurity is an accepter, while the same is strengthened in the carrier multiplication portion in the case where the impurity is a donor.

That is, the voltage which must be applied to the device can be lowered by making the impurity to be donor and by using n-type semiconductor because the electric field acting on the light absorbing layer can be reduced.

In order to estimate the degree of the video bias $V_V$ to be applied to the photoelectric conversion device according to the present invention, voltage to be applied to each layer is as follows: In the following equations, symbols represent the following factors:

$E_{V\,OFF}$: energy step of the valence band in the hetero junction portion in which the forbidden band width is discontinuously changed from the maximum value to the minimum value $d_P$: thickness of light absorbing layer $d_A$: thickness of carrier multiplication layer $d_{GRD\,int}$: thickness of one inclined band gap layer $d_{EG2\,dop}$: thickness of one layer having the maximum forbidden band to which impurities are added to a high density n: number of hetero junction portions of a layer having the maximum forbidden band and a layer having the minimum forbidden band (number of impurity layers)

k: 1 to n, position of the impurity layer counted from the light absorbing layer $N_I$: density of impurity Eg: required forbidden band width $Eg_2$: minimum forbidden band width $Eg_3$: maximum forbidden band width $\epsilon$: dielectricity constant q: electricity quantity $V_V$: voltage to be applied to the device In the case where there are n impurity layers, voltage $V_{HK}$ to be applied to each layer when the impurity layer approximating the light absorbing layer is expressed by:

$$V_{Hk} = \frac{(2k-1) \cdot q}{2\epsilon} \cdot N_I \cdot d_{EG2\,dop}^2 \qquad (5)$$

The electric field intensity $E_{Dk}$ acting at the end of each impurity layer is expressed by:

$$E_{Dk} = \frac{k \cdot q}{\epsilon} \cdot N_I \cdot d_{EG2\,dop}$$

Since also the aforesaid electric field is applied to the k-th inclined band gap layer, the voltage $V_{AI}$ to be applied to all of the inclined band gap layer is expressed by:

$$V_{AI} = \frac{n \cdot (n+1)}{2} \cdot \frac{q}{\epsilon} \cdot N_I \cdot d_{EG2\,dop} \cdot d_{GRD\,int} \qquad (6)$$

The impurity density $N_I$ is set by the following equation:

$$N_I = \frac{2\epsilon}{q} \cdot \frac{Eg_2 - E_{V\,OFF}}{d_{EG3\,dop}^2}$$

Assuming that the voltage required to deplete the inclined gap layer is superposed prior to the depletion of the impurity layer, the voltage corresponding to the superposed portion can be obtained as follows:

The voltage $V_{AI\,DEP}$ for the multiplication layer is given by:

$$V_{AI\,DEP} = n \cdot E_{V\,OFF}$$

The voltage $V_{P\,DEP}$ to be distributed to the light absorbing layer is given by:

$$V_{P\ DEP} = V_{AI\ DEP} \cdot (d_P/d_A)$$

Therefore, overall voltage $V_{DEP}$ is given by:

$$V_{DEP} = n \cdot E_{V\ OFF} ((d_P + d_A)/d_A) \qquad (7)$$

As a result, the voltage $V_V$ to be applied to the device is the sum of (5), (6) and (7). However, it can be considered that the portion of (5) is small. A value given from the following equation may be added to obtain the minimum driving voltage:

$$V_V \geq \frac{d_P + d_A}{d_A} \cdot n \cdot E_{V\ OFF} + n \cdot (n+1) \cdot \frac{d_{GRD\ int}}{d_{EG2\ dop}} \cdot (E_{g2} - E_{V\ OFF}) \qquad (8)$$

As a result, according to the present invention, there is provided a photoelectric conversion device which has the Knee characteristics in the charge storage operation and which can be drive by low voltage.

BRIEF DESCRIPTION OF THE DRAWINGS

FIGS. 6A to 6C are schematic views which illustrate a photoelectric conversion device according to an embodiment of the present invention, where FIG. 6A illustrates the structure, FIG. 6B illustrates a band profile realized when no bias is applied, and FIG. 6C illustrates a band profile when a bias is applied;

FIG. 7A illustrates the structure, FIG. 7B illustrates a band profile realized when no bias is applied, and FIG. 7C illustrates a band profile when a bias is applied;

FIG. 8A illustrates the structure, FIG. 8B illustrates a band profile realized when no bias is applied, and FIG. 8C illustrates a band profile when a bias is applied;

FIG. 16A illustrates a band profile when no bias is applied; and FIG. 16B illustrates a band profile when a bias is applied;

DETAILED DESCRIPTION OF PREFERRED EMBODIMENTS (Embodiments)

Figure 1A:
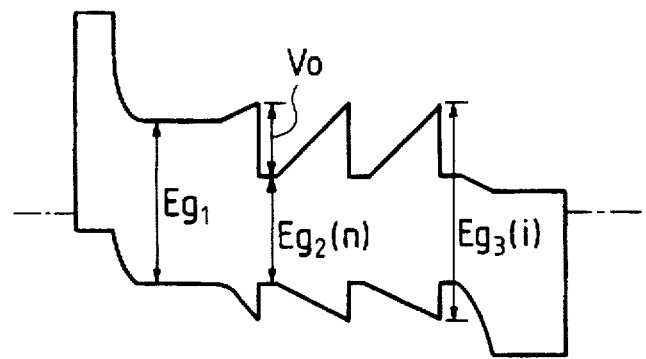
FIGS. 1A and 1B illustrate an energy band for describing the structure of a conventional photoelectric conversion device.

Embodiments of the present invention will now be described.

FIG. 6A to 6C illustrate the photoelectric conversion device according to this embodiment thus manufactured. The device according to this embodiment has a larger energy step in the conductive band in the hetero junction portion with respect to the energy step of the valence electron band and is provided with the carrier multiplication portion 612 designed to utilize the multiplication of electrons.

FIG. 6A is a cross sectional view which illustrates the structure of an embodiment of a photoelectric conversion device according to the present invention. Referring to FIG. 6A, reference numeral 602 represents a MOS source or MOS drain serving as a switch device formed on a substrate 600, and 604 represents its drain. Reference numeral 611 represents a hole blocking layer (a charge injection inhibition layer), 612 represents a carrier multiplication portion, 613 represents a light absorption layer, 614 represents an electron blocking layer (a charge injection inhibition layer), 616 represents an upper electrode, and 615 represents a passivation layer. The carrier multiplication portion 612 is composed of three layers 612a, 612b and 612c and constituting, together with the light absorbing layer 613, a photoelectric conversion portion. Furthermore, the layer 612b which constitutes the three-layered carrier multiplication portion 612 is formed into a high density p-type layer.

The thickness of the employed material may be determined to be a value which is about an average free stroke of the multiplication carrier. If the thickness is determined, the thickness of a single layer of the inclined band gap layer is determined. The thickness must be about three times the thickness of an impurity rich layer of the hetero junction portion, preferably about 10 to 20 times.

The thickness and the quantity of the added impurities of the impurity rich layer of the hetero junction portion for concentrating the electric field in order to compensate the wanting offset energy may be determined as follows.

The quantity of impurities to be added is determined to a value with which the voltage to be applied when the impurity layer has been completely depleted is higher than the quantity of the desired offset energy. That is, it is determined as follows:

$$N > \frac{2\epsilon \cdot V_D}{q \cdot d_2} \quad (10)$$

$$V_D = \frac{E_{ion} - (x_2 - x_3)}{q} \quad (11)$$

where $\epsilon$: dielectric constant of impurity layer

N: density of impurity $x_3$: electronic affinity of a layer having a maximum forbidden band $x_2$: electronic affinity of a layer having a minimum forbidden band $E_{ion}$: carrier ionizing energy d: thickness of impurity layer In the aforesaid equations, subscripts 3 and 2 respectively correspond to a wide energy band gap and a narrow energy band gap.

FIG. 6B illustrates an energy band of the photoelectric conversion device according to this embodiment thus manufactured. Similarly to FIG. 1 which illustrates the conventional example, symbol $Eg_1$, represents a required forbidden band, $Eg_2$ represents a minimum forbidden band, and $Eg_3$ represents a maximum forbidden band. Symbol $V_O$ represents energy which is the difference $(x_2-x_3)$ between electron affinity $x_2$ of a material of $Eg_2$ and electron affinity $x_3$ of a material $Eg_3$.

Figure 1B:
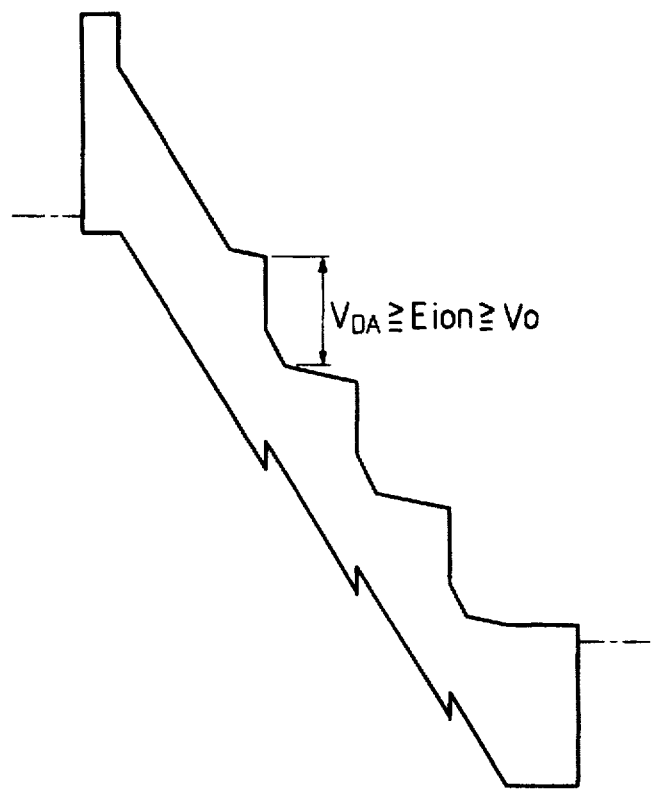
Figure 2:
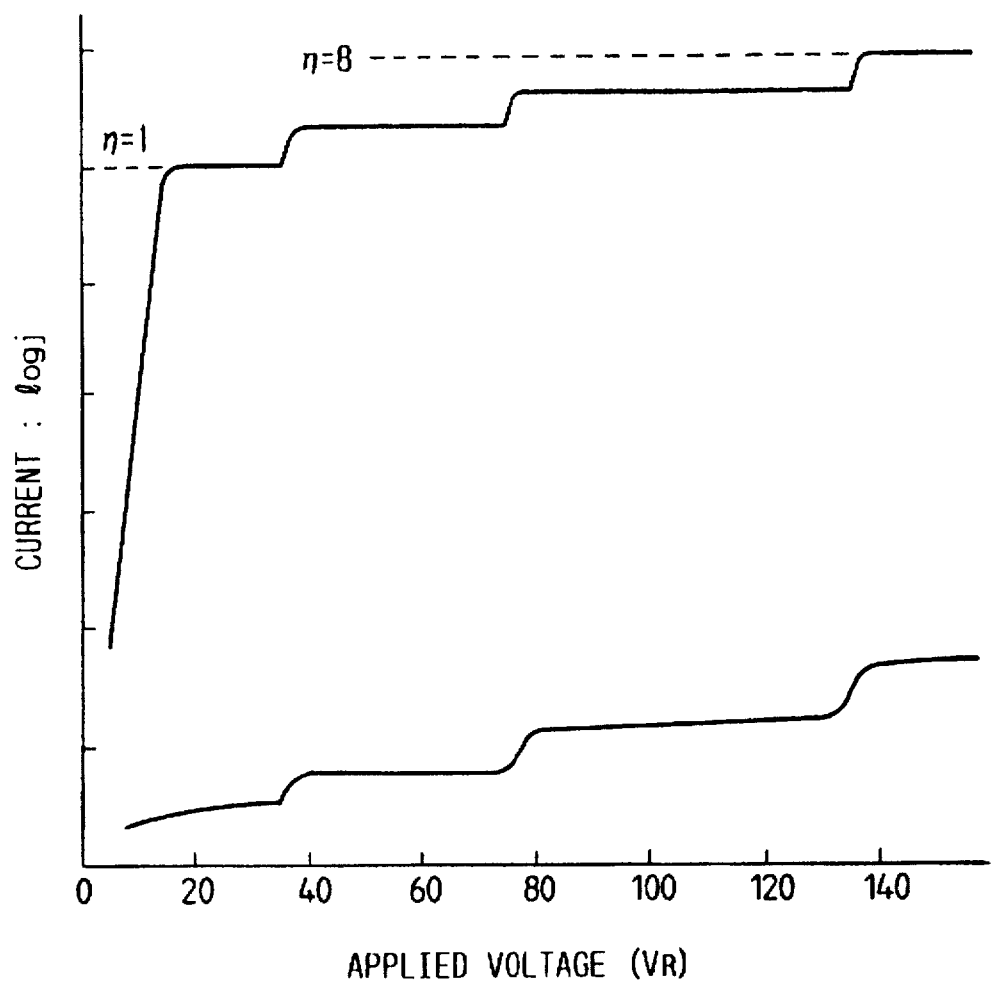
FIG. 2 is a graph which illustrates characteristics of the photoelectric conversion device between electric currents and voltages.

Although the photoelectric conversion device according to the present invention is structured similarly to the conventional example shown in FIG. 1A in such a manner that the three-step inclined band gap layer forms a hetero junction, the difference lies in that the structure of the conventional example shown in the energy band view shown in FIG. 1A and arranged in such a manner that the $Eg_2$ portion is made of an n-type structure and the $Eg_3$ portion is made of an i-type structure is replaced by a structure arranged in such a manner that the $Eg_2$ portion is made of a p-type structure and the $Eg_3$ potion is made of an i-type structure. The aforesaid structure is a characteristic of this embodiment.

FIG. 6C illustrates an energy band realized when a bias is applied. As can be seen from this, an electric field acting on the light absorbing portion $Eg_1$ is relatively weakened and an effect can be obtained in that the bias required to be applied to the overall portion of the device can be reduced.

In accordance with the aforesaid sequential process, the photoelectric conversion device according to this embodiment is manufactured.

Figure 7A:
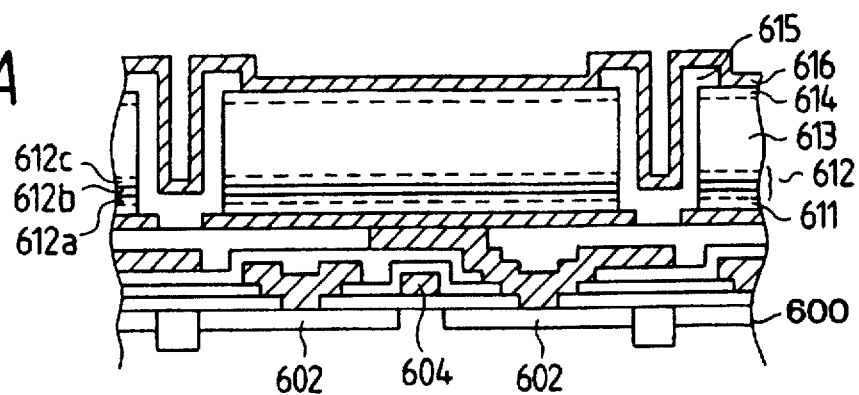
FIGS. 7A to 7C are schematic views which illustrate a photoelectric conversion device according to an embodiment of the present invention, where
Figure 7B:
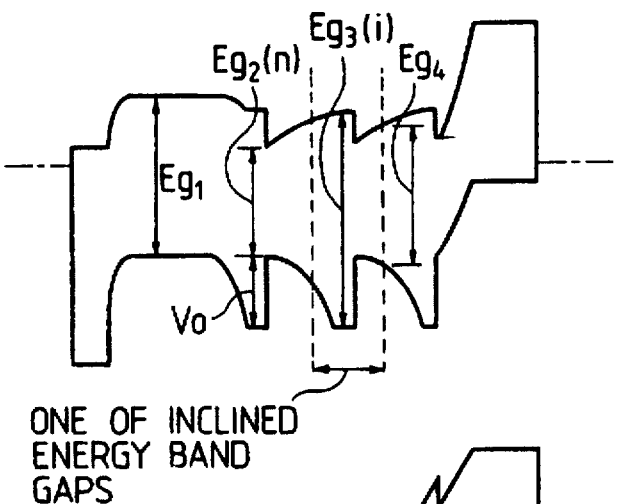
Figure 7C:
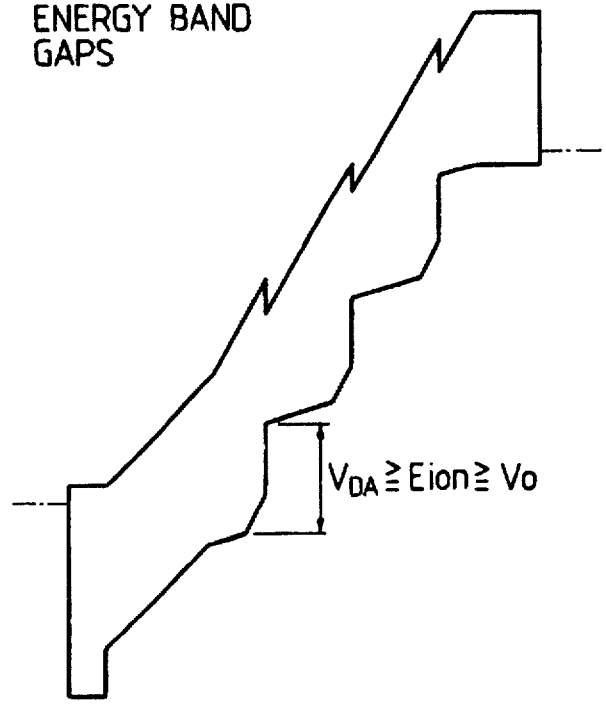

FIGS. 7A to 7C illustrate the photoelectric conversion devices according to this embodiment thus manufactured. The device according to this embodiment has a larger energy step in the valence electron band in the hetero junction portion with respect to the energy step in the conductive band and is provided with the carrier multiplication portion 612 designed to utilize the multiplication of electrons.

FIG. 7A is a cross sectional structural view which illustrates another embodiment of the photoelectric conversion device according to the present invention, wherein the structure which is formed in the case where the carrier to be multiplied is a positive hole. Referring to FIG. 7A, reference numeral 602 represents a MOS source or MOS drain serving as a switch device formed on a substrate 600, and 604 represents its drain or source, respectively. Reference numeral 611 represents an electron blocking layer (a charge injection inhibition layer), 612 represents a carrier multiplication portion, 613 represents a light absorption layer, 614 represents a positive hole blocking layer (a charge injection inhibition layer), 616 represents an upper electrode, and 615 represents a passivation layer. The carrier multiplication portion 612 is composed of three layers 612a, 612b and 612c and constituting, together with the light absorbing layer 613, a photoelectric conversion portion. Furthermore, the layer 612b which constitutes the three-layered carrier multiplication portion 612 is formed into a high density i.e. highly doped p-type layer.

The thickness and the quantity of the added impurities of the impurity additional layer of the hetero junction portion for concentrating the electric field in order to compensate the wanting offset energy may be determined as follows.

The quantity of impurities to be added is determined to a value with which the voltage to be applied when the impurity layer has been completely depleted is higher than the quantity of the wanting offset energy. That is, it is determined as follows:

$$N > \frac{2\epsilon \cdot V_D}{q \cdot d_2} \quad (12)$$

$$V_D = \frac{E_{ion} - (x_2 - x_3) - (E_{g3} - E_{g2})}{q} \quad (13)$$

where $\epsilon$: dielectric constant of impurity layer

N: density of impurity $x_3$: electronic affinity of a layer having a maximum forbidden band $x_2$: electronic affinity of a layer having a minimum forbidden band $E_{ion}$: carrier ionizing energy d: thickness of impurity layer In the aforesaid equations, subscripts 3 and 2 respectively correspond to a wide energy band gap and a narrow energy band gap, and Eg $_3$ and Eg $_2$ are band gaps of the impurity layer.

FIG. 7B illustrates an energy band of the photoelectric conversion device according to this embodiment thus manufactured. Symbol $Eg_1$ represents a required forbidden band, $Eg_2$ represents a minimum forbidden band, and $Eg_3$ represents a maximum forbidden band. Symbol $V_O$ represents energy which is the difference $(x_2-x_3)$ between electron affinity $x_2$ of a material $eg_2$ and electron affinity $x_3$ of a material $Eg_3$.

FIG. 7C illustrates an energy band realized when a bias is applied. As can be seen from this, an electric field acting on the light absorbing portion $Eg_1$ is relatively weakened and an effect can be obtained in that the bias required to be applied to the overall portion of the device can be reduced.

Figure 8A:
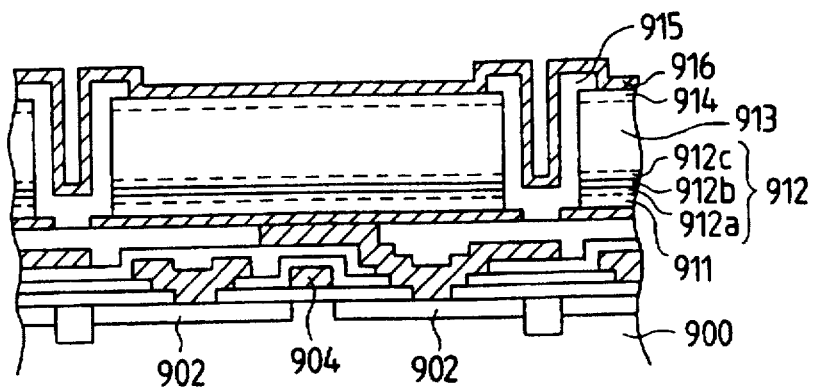
FIGS. 8A to 8C are schematic views which illustrate a photoelectric conversion device according to an embodiment of the present invention, where
Figure 8B:
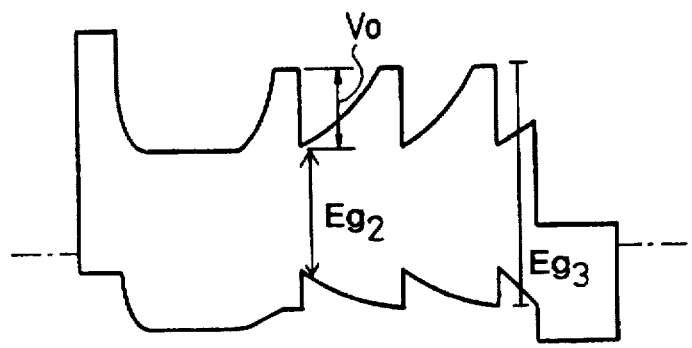
Figure 8C:
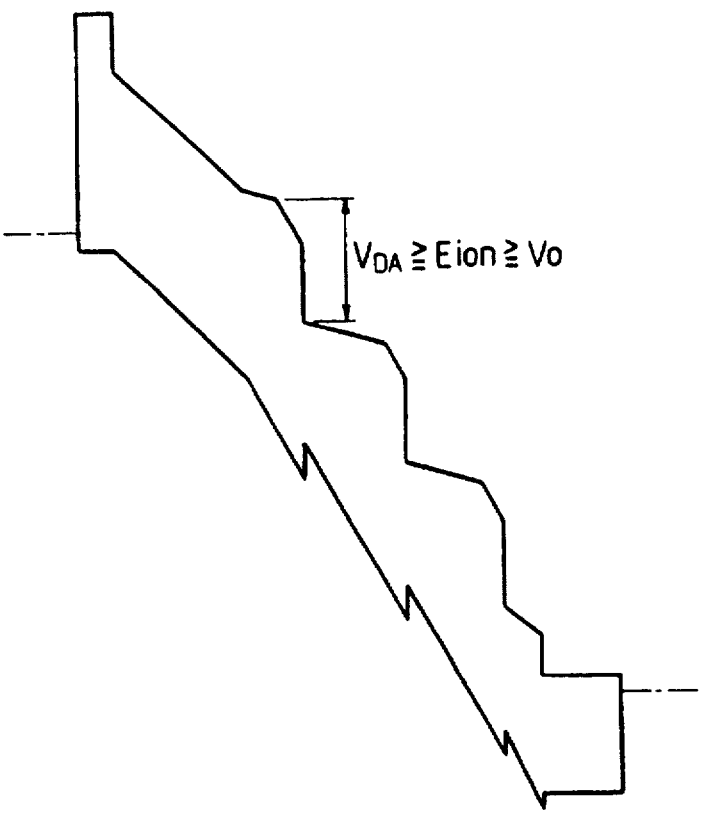

FIG. 8 illustrates another embodiment of the photoelectric conversion device according to the present invention, wherein FIG. 8A is a cross sectional structural view, FIG. 8B illustrates an energy band realized when no bias is applied, and FIG. 8C illustrates an energy band realized when a bias required to cause the carrier multiplication to take place.

Figure 3A:
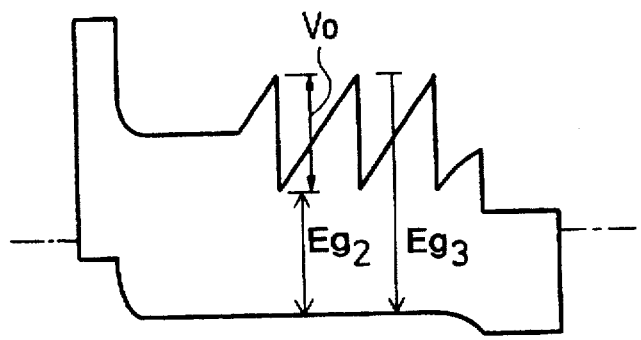
FIG. 3A illustrates an energy band of the conventional photoelectric conversion device realized when no bias is applied.
Figure 3B:
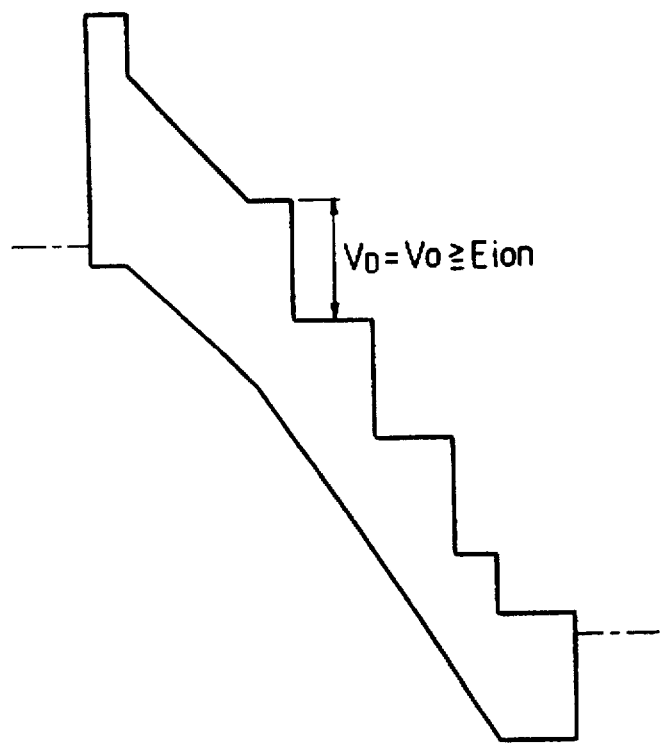
FIG. 3B illustrates an energy band realized when a bias required to cause a carrier multiplication to take place is applied, FIG. 3B being further schematically shown in comparison to FIG. 1.
Figure 4:
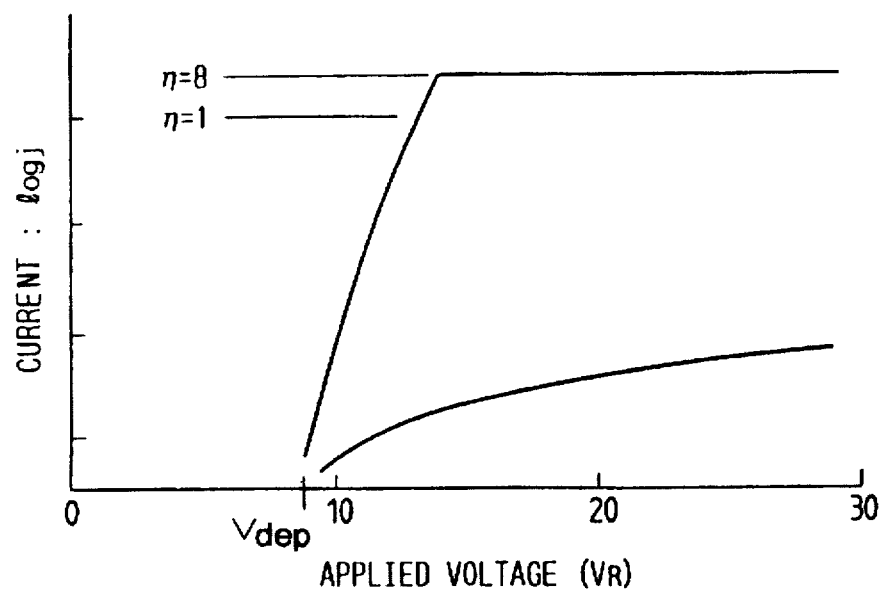
FIG. 4 is a graph which illustrates characteristics of the photoelectric conversion device shown in FIG. 3A between electric currents and voltages.
Figure 5:
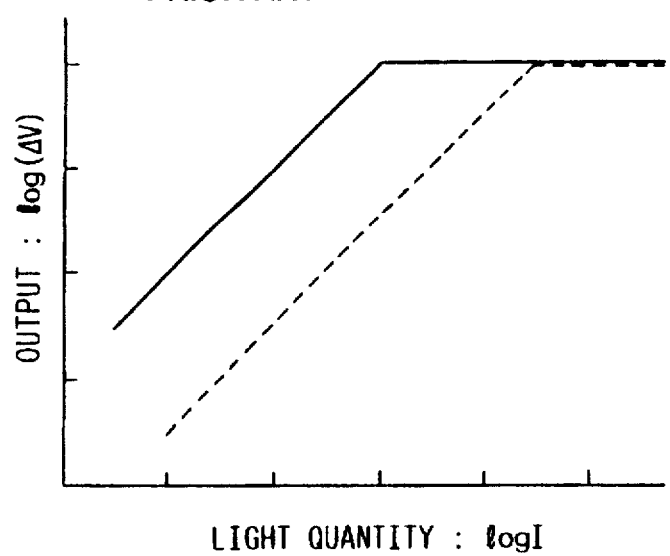
FIG. 5 illustrates the photoelectric conversion characteristics of the photoelectric conversion device shown in FIG. 3A.

In comparison to the energy band of the conventional example shown in FIG. 3B, the energy band of the present invention shown in FIG. 8C is different from it in a fact that there is no increase of the energy step due to the application of the bias because the hetero junction portion is not subjected to the impurity doping. The aforesaid fact is a characteristic of the driving method according to the present invention.

Figure 9:
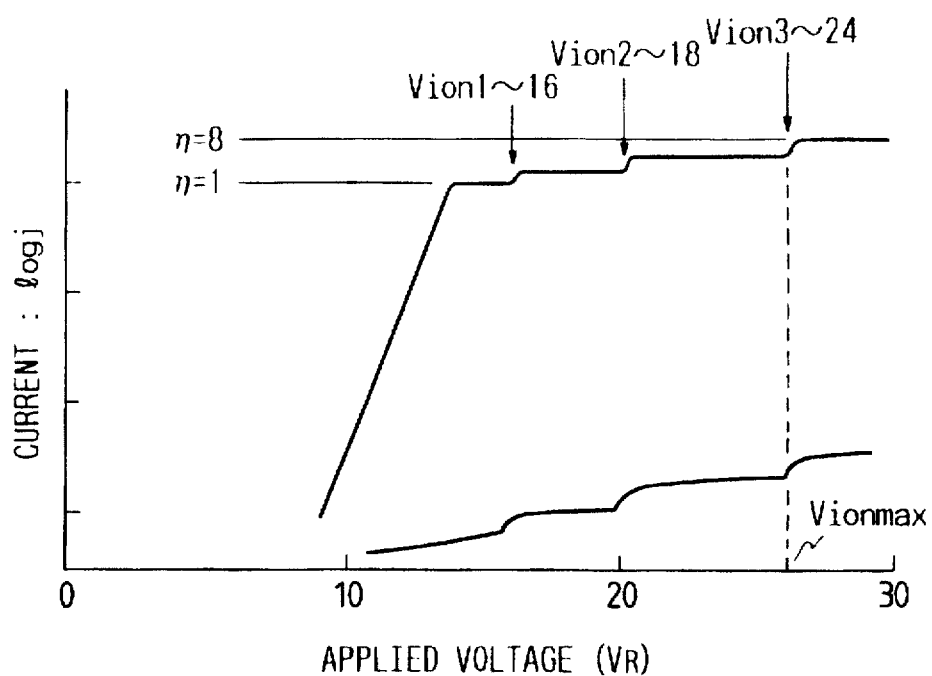
FIG. 9 is a graph which illustrates characteristics of the photoelectric conversion device shown in FIG. 8A between electric currents and voltages.

FIG. 9 is a graph which illustrates the characteristics between electric currents and voltages of the APD, the APD having, as the device structure, a carrier multiplication portion composed of three stages. As shown in FIG. 9, with a method of driving the photoelectric conversion device according to the present invention, an electric current corresponding to a quantum efficiency 2 starts passing at a position in the neighborhood of ionization commencement voltage $V_{ion1}$, and then an electric current corresponding to quantum efficiencies 4 and 8 starts gradually passing at positions in the neighborhood of $V_{ion2}$ and $V_{ion3}$.

Figure 10:
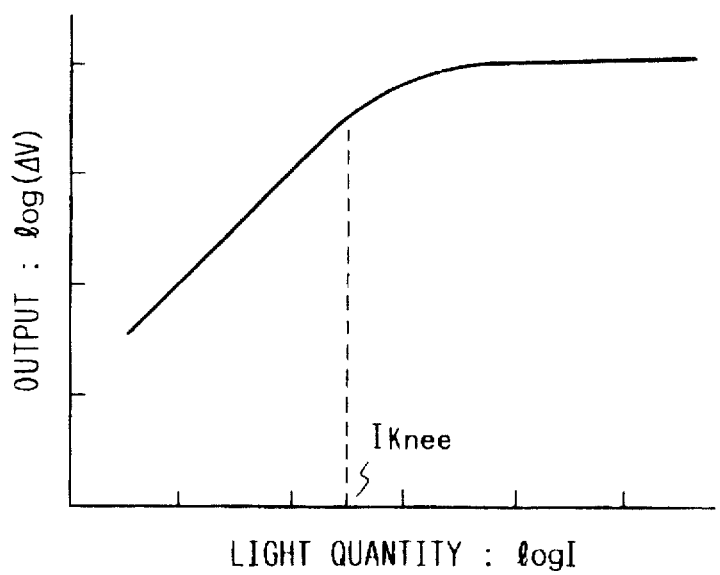
FIG. 10 illustrates the photoelectric conversion characteristics of the photoelectric conversion device shown in FIG. 8A.

FIG. 10 illustrates the relationship between inputs and outputs realized when the storage operation is performed by applying a bias higher than $V_{ion3}$ to the device according to this embodiment. The output is changed in this way that its inclination with respect to the input is changed if it exceeds a certain light quantity to become moderate by a degree corresponding to the step of the current-voltage characteristics until it is saturated. Output saturation characteristics of the aforesaid type can be approximately assumed to be a so-called Knee characteristics with which the dynamic range can be widened. That is, it can be understood that the dynamic range can be widened by a degree (about 8 times according to this embodiment) which equivalents to the multiplication ratio in comparison to the case where the output has no Knee characteristics by superposing the boundary of the subject light quantity region on a point at which the saturation characteristics are commenced.

Figure 11:
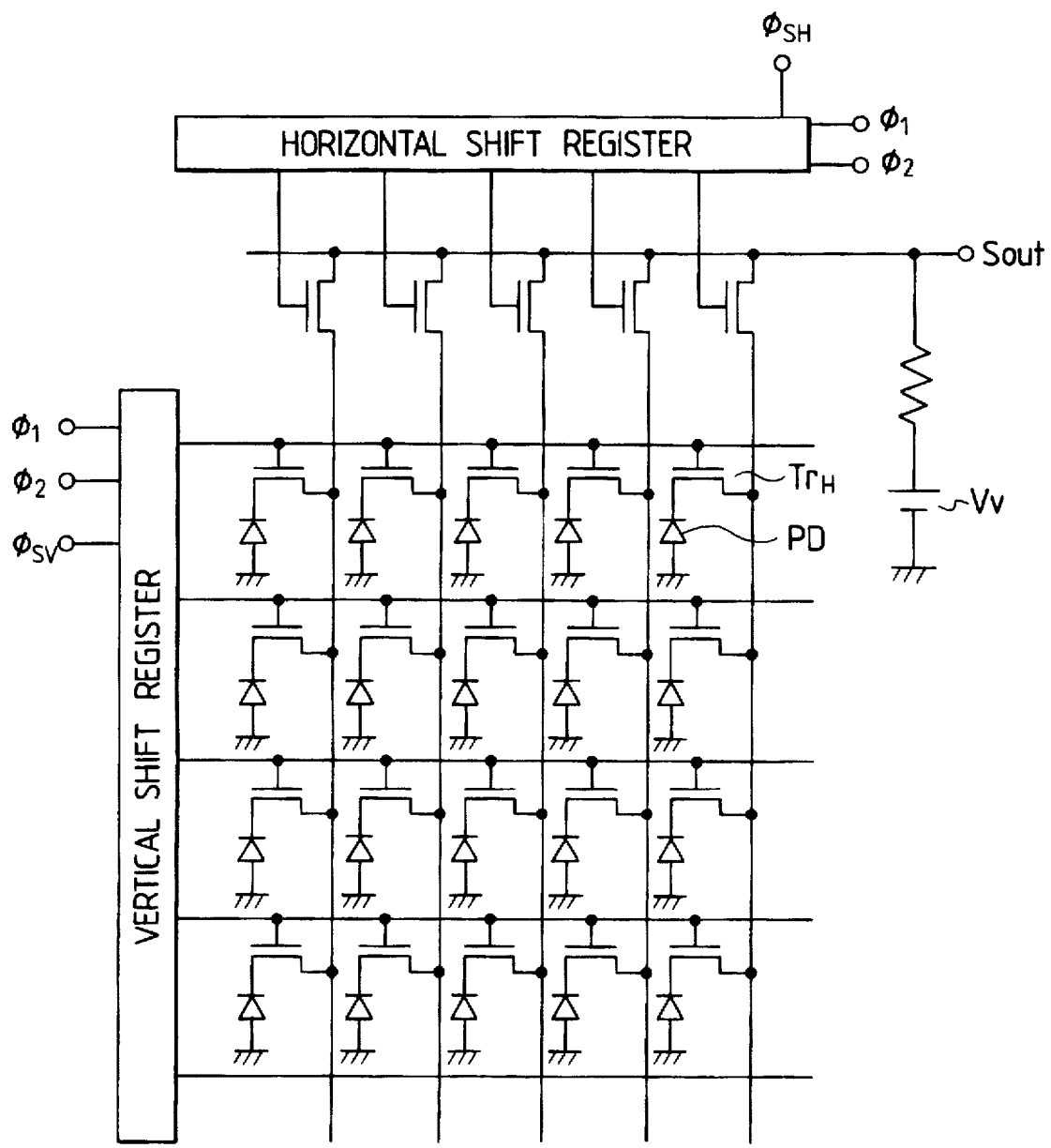
FIG. 11 is a circuit diagram which illustrates the circuit structure of a photoelectric conversion device according to the present invention.

FIG. 11 illustrates an example of the structure of a circuit for use in the photoelectric conversion device according to the present invention. Referring to FIG. 11 the charge, which has been generated in a photoelectric conversion device PD before it is multiplied, is divided into a portion to be stored in a capacitance $C_{PD}$ of the PD and a portion to be stored in a junction capacitance $C_D$ of the source portion of the switch MOS transistor $Tr_H$. Assuming that the storage time is $t_s$, output voltage $\Delta V$ realized when light having a certain light quantity of I is incident can be given from the following equation:

$$\Delta V = q \cdot k \cdot I \cdot A \cdot t_s / (C_{PD} + C_D)$$

where q: unit charge quantity k: multiplication constant

A: area of PD

Referring to FIG. 10, it may be considered that the bias voltage applied to the APD having the three-stage multiplication portion coincides with $V_{ion3}$ shown in FIG. 9 at the light quantity (hereinafter called, for example, a "Knee commencement light quantity $I_{Knee}$") at which the Knee characteristics are realized.

Assuming that the video bias voltage to be applied to the photoelectric conversion device according to the present invention is $V_V$ expressed as follows:

$$V_V = V_{ion3} + q \cdot k \cdot I_{Knee} \cdot A \cdot t_s / (C_{PD} + C_D)$$

That is, an optimum dynamic range and sensitivity can be obtained by setting $V_V$ as follows while assuming that the voltage (voltage with which the multiplication of the electric current is saturated) required for the multiplication to take place in all of n steps of an APD having n-step hetero multiplication portion is $V_{ionmax}$:

$$V_V = V_{ionmax} + q \cdot k \cdot I_{Knee} \cdot A \cdot t_s / (C_{PD} + C_D) \tag{14}$$

where $V_{ionmax}$: voltage at which multiplication of current is saturated q: unit charge quantity k: multiplication constant $I_{Knee}$: light quantity with which Knee characteristics starts taking place A: area of one pixel $t_s$: charge storage time $C_{PD}$: capacitance of photoelectric conversion device portion $C_D$: storage capacitance of switch device As a result, a photoelectric conversion device having excellent sensitivity and a large wide dynamic range can be provided.

The quantity of the impurities to be added must be determined to a value with which the voltage which is applied when the impurity layer has been completely depleted made higher than the wanting quantity of the offset energy. That is, it is determined as follows depending upon the fact that the impurity layers are disposed at the two ends of the inclined band gap layer and the fact that the same is disposed at an end of the inclined band gap layer.

(1) In the case where the impurity layers are present at the two ends of the inclined band gap layer, it is determined by combining the following factors $N_1$ and $N_2$:

$$\frac{q \cdot (\epsilon_1 N_1 + \epsilon_2 N_2)}{2\epsilon_1 \epsilon_2} \cdot \left( \frac{N_1}{N_2} \cdot d_1^2 + \frac{N_2}{N_1} \cdot d_2^2 \right) > V_D \tag{15}$$

$$V_D = \frac{E_{ion} - (x_2 - x_1)}{q} \tag{16}$$

where subscripts 1 and 2 correspond to the wide gap and the narrow gap, $\epsilon_1$ and $\epsilon_2$ are dielectric constant, $N_1$ and $N_2$ are densities of the impurities, $x_1$ and $x_2$ are electronic affinities, $E_{ion}$ is a carrier ionizing energy, and $d_1$ and $d_2$ are thicknesses of the impurity layer. In comparison to the aforesaid electron current, the following $V_D$ is employed in the case of a positive hole:

$$V_D = \frac{E_{ion} - (x_2 - x_1) - (E_{g1} - E_{g2})}{q} \tag{17}$$

where $E_{g1}$ and $E_{g2}$ are band gaps of the impurity layer.

(2) In the case where the impurity layers are present at the two ends of the inclined band gap layer, the quantity can be determined by the factors expressed as follows:

$$N > \frac{2\epsilon \cdot V_D}{q \cdot d^2} \tag{18}$$

$$V_D = \frac{E_{ion} - (x_2 - x_1)}{q} \tag{19}$$

where $\epsilon$ is a dielectric constant of the impurity layer, N is the density of the impurities, and d is the thickness of the impurity layer.

In comparison to the aforesaid case adapted to the electron current, the quantity in the case of the positive current is determined by the factors expressed as follows:

$$V_D = \frac{E_{ion} - (x_2 - x_1) - (E_{g1} - E_{g2})}{q} \quad (20)$$

The bias voltage $V_V$ to be applied to the photoelectric conversion device thus manufactured is obtained by using the following parameter in accordance with Equation (21):

$V_{ionmax}$: voltage at which multiplication of the electric current is saturated q: unit charge quantity $I_{Knee}$: light quantity at which Knee characteristics takes place A: area of one pixel $t_s$: charge storage time k: multiplication constant $C_{PD}$: capacitance of photoelectric conversion device $C_D$: charge storage capacitance of the switch device $$V_V V_{ionmax} + q \cdot k \cdot I_{Knee} \cdot A \cdot t_s / (C_{PD} + C_D) \quad (21)$$

By applying $V_V$ thus obtained, the photoelectric conversion device can be driven by a lower voltage level in comparison to the conventional technology.

As the substrate for use in the present invention, any one of an insulating substrate, a semiconductor substrate or a metal substrate may be employed if it is able to resist the temperature at the time of the deposition of the films on the substrate, an acid, alkali and a solvent for use to perform the required processes. For example, insulating substrates of a type arranged in such a manner that switch devices and scanning devices are formed on glass, quartz or ceramics are widely used. Also a heat resisting resin film is employed. Semiconductor substrates of a type having a signal processing circuit such as a switch device, an amplifier, and a scanning device are employed. The signal processing circuit is typified by a CCD device, a MOS device, a BBD device and an image sensor disclosed in U.S. Pat. No. 4,791,469 and arranged in such a manner that an emitter of a bipolar phototransistor is connected to an output circuit including a capacitative load.

As for the electrode film, either side employs a light transmissive electrode for receiving incidental light, the light transmissive electrode being exemplified by a metal film having a thickness of tens to hundreds of Å and a conductive metal oxide film made of $SnO_2$, ITO, $ZnO_2$, $IrO_x$ or the like. The residual side is usually made of a metal film which may be selected from a group which meets required conditions such as resistance and chemical properties.

As the photoconductive film and a carrier multiplication portion, a semiconductor, the valence electron thereof can be controlled, can be employed in the present invention, the semiconductor being exemplified by a tetrahedral (group IV) semiconductor or a composition semiconductor of groups III to V. Semiconductors of group IV are exemplified by Ge, Si, C and their complexes SiGe, SiC, SiGeC, and SiN, SiO and SiSn.

The i-layer portion (non-dope or a small quantity dope layer) of the semiconductor may be formed into a structure selected from a group consisting of crystal, polycrystal, microcrystal, and amorphous. The term "microcrystal" used hereinbefore is meant a structure containing crystal particles the size of which is tens to hundreds of Å in the amorphous portion thereof and the crystallization rate is raised to tens to 100%.

As the impurity to be added for the purpose of controlling the valence electron, a group V material is used to control the N-type valence electrons, and a group III material is used to control the P-type valence electrons. Any one of the group V materials such as P, As, Sb and Bi may be employed, and any one of the group III materials such as B, Al, Ga, In and Ta may be employed.

The polycrystal or the microcrystal high density impurity layer may be mainly formed by a CVD method selected from a group consisting of a plasma CVD method, a light CVD method, a heat CVD method, a μW-CVD method, an LP-CVD method, a room pressure CVD method. The crystal particle size is controlled to a size to meet conditions such as the power, the temperature of the substrate, the light quantity, the pressure, and the gas flow rate, and the like (the crystal particle size for determining the conditions is evaluated by an X-ray diffraction method or a direct observation method which uses a TEM).

The groups III and V semiconductors are exemplified by AlGaAsSb, InAsSb, InGaAsSb, InGaAlAs, InAsPSb, InGaAsSb and AlGaP. Any of the materials of group VI such as S, Se, Te and Po may be employed, and any one of the group II materials such as Be, Mg, Ca, Sr, Ba, Ra, Zn, Cd and Hg may be used.

(EXAMPLE 1)

This embodiment relates to an apparatus having a cross sectional structure formed as shown in FIG. 6A, an energy band profile realized when no bias is applied to the photoelectric conversion device portion and shown in FIG. 6B and an energy band profile realized when a bias required to cause the carrier multiplication to take place and shown in FIG. 6C.

FIGS. 12A to 12F are cross sectional views which illustrates a process of manufacturing the photoelectric conversion device according to the present invention.

First, the photoelectric conversion device according to this embodiment will now be described with reference to the manufacturing process shown in FIGS. 12A to 12F.

Figure 12A:
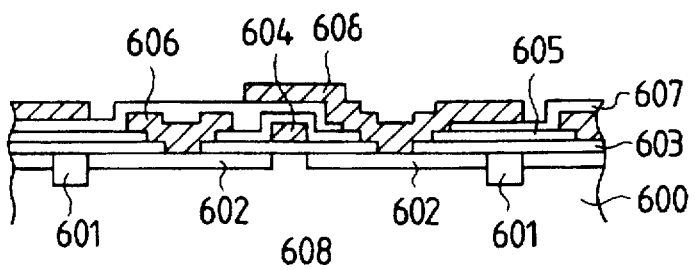
FIGS. 12A to 12F are schematic views which illustrate a process for manufacturing a device according to example 1.

First, a scanning IC substrate comprising a MOS transistor is manufactured by an ordinary MOS processing technology (FIG. 12A).

Figure 12B:
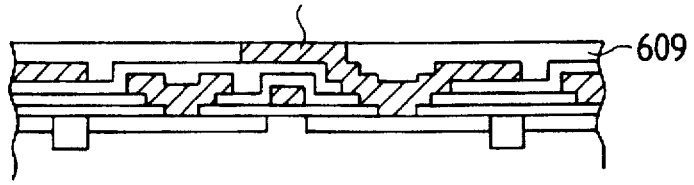

Then, the surface of the substrate is flattened for the purpose of stacking the photoelectric conversion device in such a manner that a taking-out electrode 608 is formed in process (FIG. 12A), and a $SiO_2$ film 609 is deposited by 8000 Å. Then, an ordinary photoresist is spin-coated so that the surface is flattened before it is etched back by a RIE so as to cause the top portion of the electrode 608 to appear while maintaining the flatness (FIG. 12B).

Figure 12C:
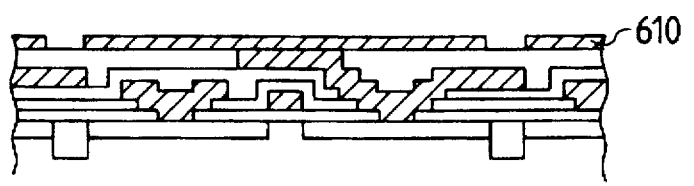

Then, Cr is deposited to a thickness of 2000 Å by an ordinary sputtering method, and a desired shape is formed by an ordinary photolithographic process, so that a pixel electrode 610 is formed (FIG. 12C). Then, the sample is placed in a capacitance-coupled plasma CVD apparatus in which a $SiH_4$ gas and a $PH_3$ gas diluted to 10% by a $H_2$ gas are introduced into the aforesaid apparatus by quantities of 60 SCCM and 20 SCCM respectively so as to perform RF discharge for about 5.5 minutes while making the total gas pressure to be 0.2 Torr. As a result, a hole blocking layer 611 which is an n-type high density layer made of a-Si:H and having a thickness of about 1000 Å is deposited. The temperature of the substrate is 300° C. and the density of the discharge power is about 0.2 W/cm² at this time.

Then, in the aforesaid CVD apparatus, the $SiH_4$ gas is continuously changed from 60 SCCM to 6 SCCM and a $GeH_4$, gas is continuously changed from 0 SCCM to 54 SCCM in the aforesaid CVD apparatus, and an RF discharge is performed for 2.8 minutes under conditions that the temperature of the substrate is 300° C., the total gas pressure is 0.2 Torr, the RF power density is about 0.5 W/cm², so that an inclined band cap layer 612a made of a-SiGe:H is deposited to have a thickness of about 500 Å (a deposition process 1).

Then, in the aforesaid CVD apparatus, a 6 SCCM SiH₄ gas, a 54 SCCM GeH₄ gas and a 6 SCCM B₂H₆ gas diluted to 10% by a H₂ gas are introduced into the aforesaid CVD apparatus and RF discharge is performed for 34 seconds under conditions that the temperature of the substrate is 300° C., the total gas pressure is 0.2 Torr, the RF power density is about 0.5 W/cm², so that a p-type layer 612b made of a-SiGe:H is deposited to have a thickness of about 100 Å (a deposition process 2).

Then, in the aforesaid CVD apparatus, the flow rate of the SiH₄ gas is gradually changed from 24 SCCM to 60 SCCM and the flow rate of the CH₄ gas is gradually changed from 36 SCCM to 0 SCCM, and RF discharge is performed for about 4.7 minutes seconds under Conditions that the temperature of the substrate is 300° C., the total gas pressure is 0.3 Torr, the RF power density is about 0.2 W/cm², so that an inclined band gap layer 612c made of a-SiC:H is deposited to have a thickness of about 500 Å (a deposition process 3).

Then, the aforesaid deposition processes 1 to 3 are repeated two times, so that three inclined band gap layers are formed.

Figure 12D:
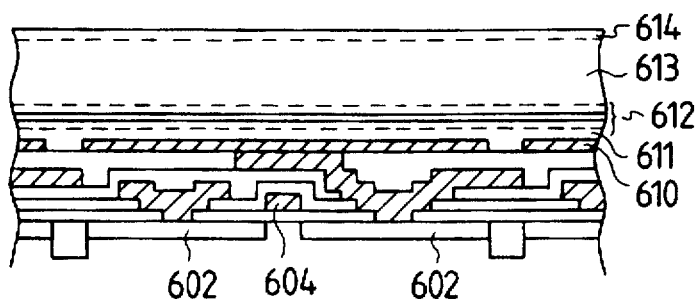

Then, in the aforesaid CVD apparatus, the flow rate of the SiH₄ gas is set to 30 SCCM and that of the H₂ gas is set to 30 SCCM, and RF discharge is performed for about 75 minutes under conditions that the temperature of the substrate is 300° C., the total gas pressure is 0.3 Torr, the RF power density is about 0.2 W/cm², so that a light absorbing layer 613 having a thickness of about 8000 Å is formed. Then, a 24 SCCM SiH₄ gas, a 20 SCCM B₂H₆ gas diluted to 10% by a H₂ gas and a 36 SCCM CH₄ gas are introduced, and discharge was performed for about 4.7 minutes under the same conditions as those in the deposition process 2, so that a blocking layer 614 having a thickness of about 500 Å is formed (FIG. 12D).

Figure 12E:
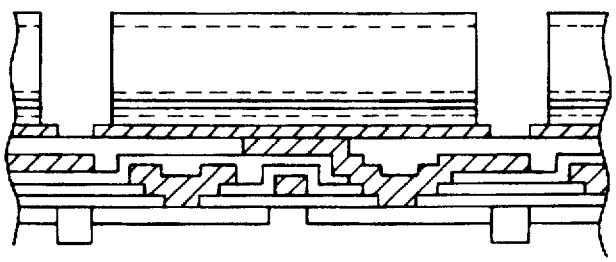

Then the semiconductor layers 611 to 614 are patterned to be a desired shape and the device was isolated (FIG. 12E).

Figure 12F:
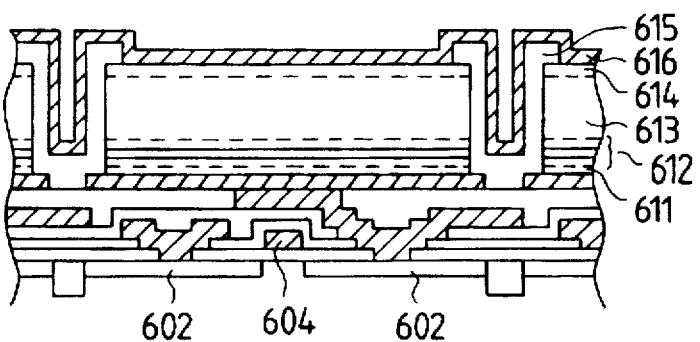

Then, the sample is placed in another capacity-coupled plasma CVD apparatus, 10 SCCM of a SiH₄ gas diluted to 10% by a H₂ gas and 100 SCCM 99.99% NH₃ gas are introduced, and an RF discharge is performed for about 60 minutes under conditions that the temperature of the substrate is 300° C., the total gas pressure is 0.4 Torr, the RF power density is about 0.01 W/cm², so that a protection layer 615 having a thickness of about 3000 Å and made of SH$_x$ film is formed. Then, a through hole is formed in the protection layer 615, and an ITO film 616 having a thickness of 700 Å is formed by a sputtering method, so that a photoelectric conversion device is manufactured (FIG. 12F).

In accordance with the aforesaid sequential process, the photoelectric conversion device according to this embodiment is manufactured.

Figure 13:
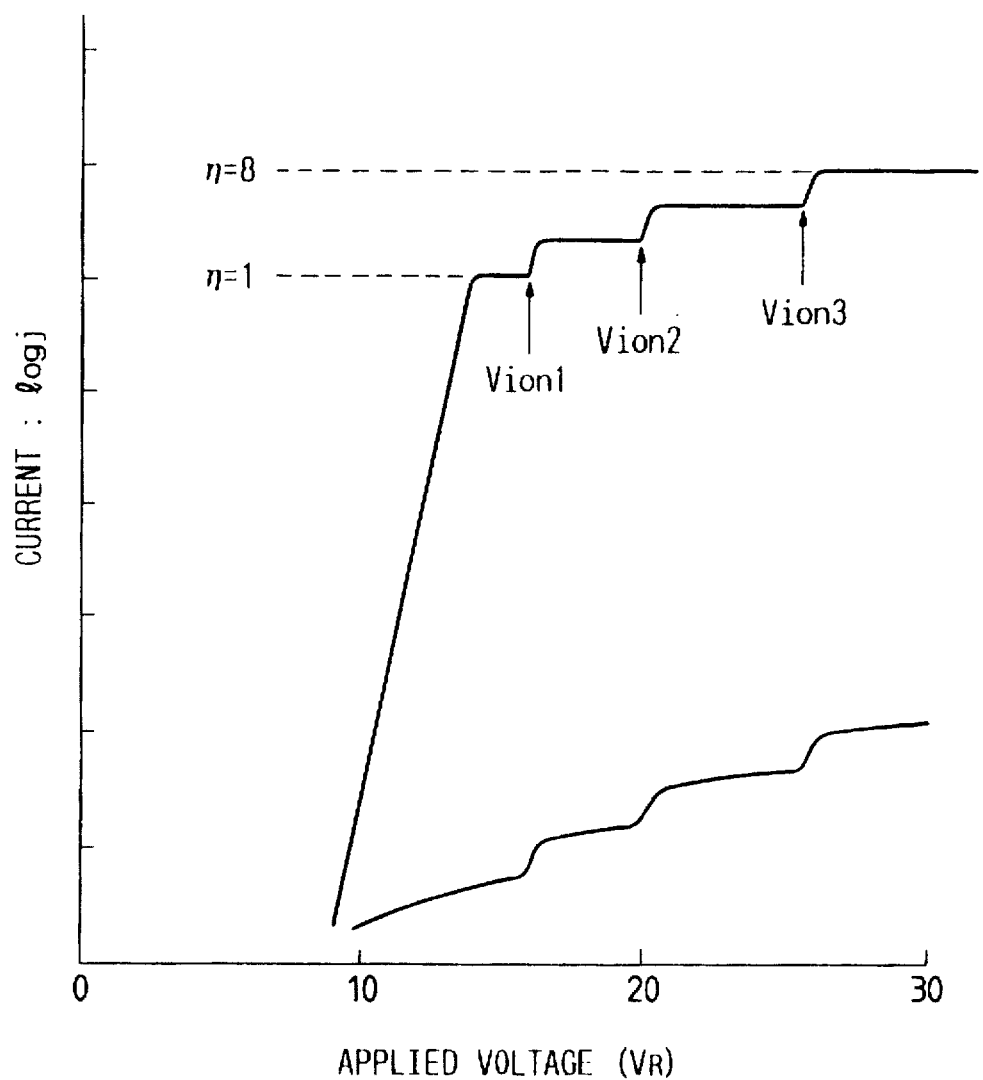
FIG. 13 is a graph which illustrates characteristics of the photoelectric conversion device shown in FIG. 6A between electric currents and voltages.

FIG. 13 is a graph which illustrates the characteristics between electric currents and voltages of the APD, the APD having the three-step carrier multiplication portion as shown in FIGS. 6A to 6C. As shown in FIG. 13, an electric current corresponding to a quantum efficiency 2 starts passing at a position in the neighborhood exceeding ionization commencement voltage $V_{ion1}$ and then an electric current corresponding to quantum efficiencies 4 and 8 starts gradually passing at positions in the neighborhood of $V_{ion2}$ and $V_{ion3}$.

Figure 14:
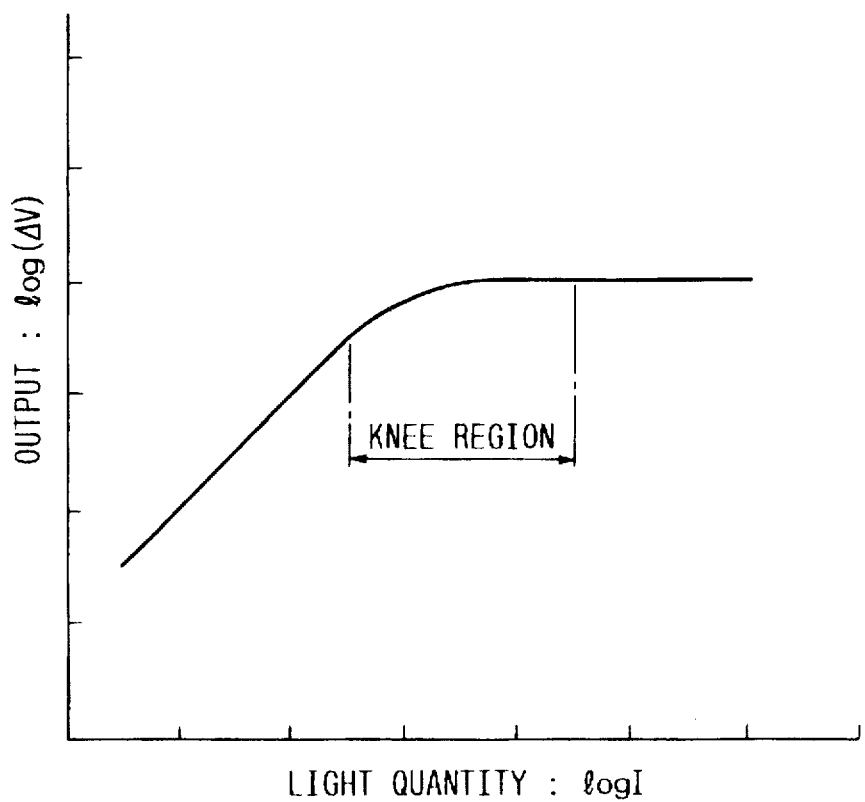
FIG. 14 illustrates the photoelectric conversion characteristics realized when an operation of storing a charge into the photoelectric conversion device shown in FIG. 6A.
Figure 15A:
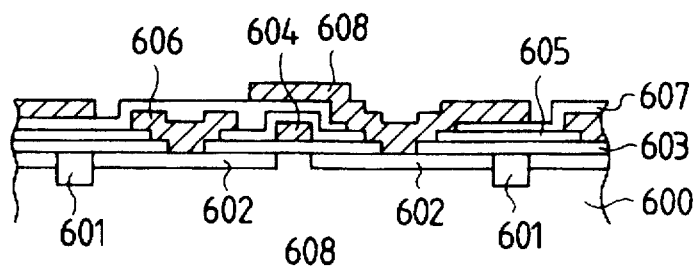
FIGS. 15A to 15F are schematic views which illustrate a process for manufacturing a device according to example 2.
Figure 15B:
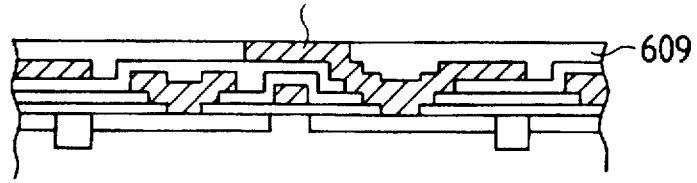
Figure 15C:
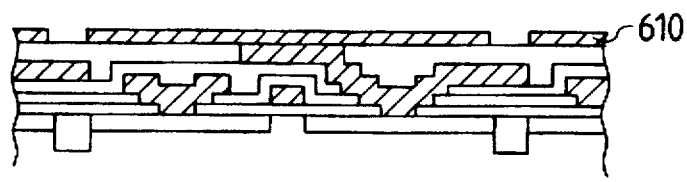
Figure 15D:
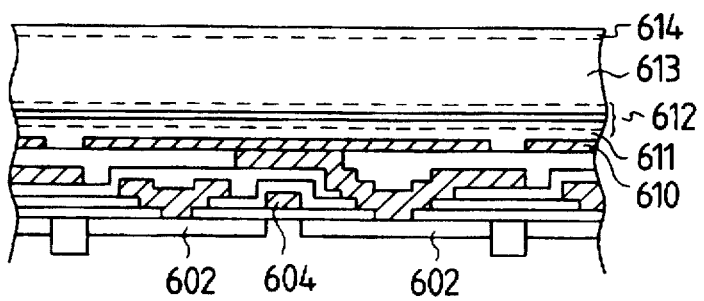
Figure 15E:
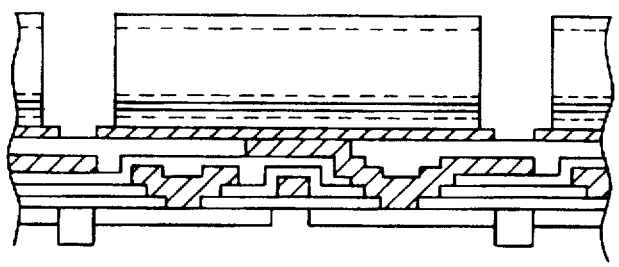
Figure 15F:
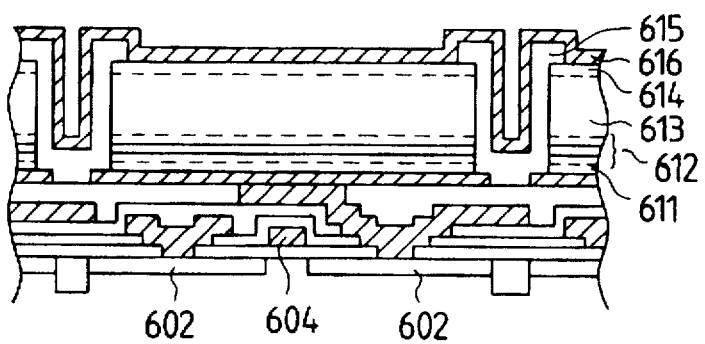

FIG. 14 illustrates the relationship between inputs and outputs realized when the storage operation is performed by applying a bias voltage higher than $V_{ion3}$ to the device according to this embodiment. The output is, as shown in FIG. 14, changed in this way that its inclination with respect to the input is changed if it exceeds a certain light quantity to become moderate by a degree corresponding to the step of the current-voltage characteristics until it is saturated. An output saturation characteristics of the aforesaid type can be approximately assumed to be a so-called Knee characteristics with which the dynamic range can be widened.

That is, it can be understood that the dynamic range can be widened by a degree (about 8 times according to this embodiment) which equivalents to the multiplication ratio in comparison to the case where the output has no Knee characteristics by superposing the boundary of the subject light quantity region on a point at which the saturation characteristics are commenced.

Then, a method of driving the photoelectric conversion device according to this embodiment and thus manufactured with a minimum voltage level will now be described.

As described above, the bias voltage $V_V$ to be applied to the two ends of the light absorbing layer and the carrier multiplication layer of the photoelectric conversion device must meet the following relationship:

$$V_V \geq \frac{d_P + d_A}{d_A} \cdot n \cdot E_{C\,OFF} + n \cdot (n+1) \cdot \frac{d_{GRD\,int}}{d_{EG2\,dop}} \cdot (E_{g2} - E_{C\,OFF}) \quad (22)$$

where $E_{C\,OFF}$: energy step of the conductive band in the hetero junction portion in which the forbidden band is discontinuously changed from the maximum value to the minimum value $d_P$: thickness of light absorbing layer $d_A$: thickness of carrier multiplication layer $d_{GRD\,int}$: thickness of one inclined band gap layer $d_{EG2\,dop}$: thickness of one layer having the maximum forbidden band to which impurities are added to a high density n: number of hetero junction portions of layer having the maximum forbidden band and a layer having the minimum forbidden band In the case of this embodiment, the aforesaid parameters are as follows assuming that $E_{g2}=1.2$, $E_{g3}=2.5$, $E_{V\,OFF}=0.2$ and $E_{C\,OFF}=1.1$, $d_P=8000$ Å

$d_A=3000$ Å

$d_{GRD\,int}=1000$ Å

$d_{EG2\,dop}=100$ Å n=3.

Substituting the aforesaid parameters to aforesaid Equation (22), the following result is obtained:

$$V_V \geq \frac{8000 + 3000}{3000} \times 3 \times 1.1 + 3 \times (3+1) \times \frac{1000}{100} \times$$

$$(1.2 - 1.1) = 24.1$$

Therefore, the aforesaid equation can be met if 30 V is applied as the bias voltage (video voltage).

When a video voltage $V_V$ of 30 V was added to the photoelectric conversion device thus manufactured while making the voltage level at the light absorbing layer to be lower than that at the carrier multiplication layer, the Knee characteristics took place in the output in the neighborhood of a surface illuminance of the photoelectric conversion device of about 300 lux, and it was saturated at about 2000 lux, and a dynamic range of about 95 dB was obtained.

A sensitivity of 8 times the sensitivity, which was realized when an ordinary PN, PIN, or shot key device was used, was obtained. Thus, excellent sensitivity and wide dynamic range were realized.

As described above, according to the present invention, the Knee characteristics can be attained in the charge storage operation, the dynamic range can be widened, and excellent sensitivity can be realized since the photoelectric conversion device, on which the APD arranged to utilize the electron multiplication and having a structure formed by repeating the inclined band gap is mounted, is arranged in such a manner that at least a portion having the minimum forbidden width $Eg_2$ of the hetero junction portion of the minimum forbidden band $Eg_2$ portion of the inclined band gap layer and the maximum forbidden band $Eg_3$ portion of the other inclined band gap layer is made to be a high density P-type semiconductor layer.

Furthermore, the photoelectric conversion device can be driven by a voltage level lower than that required in the conventional example by making the bias voltage $V_V$ to be added to the device to be lower in the light absorbing layer than that to be applied to the carrier multiplication layer while meeting the conditional equation.

(EXAMPLE 2)

This embodiment relates to an apparatus having a cross sectional structure formed as shown in FIG. 8A, an energy band profile realized when no bias is applied to the photoelectric conversion device portion and shown in FIG. 8B and an energy band profile realized when a bias required to cause the carrier multiplication to take place and shown in FIG. 8C.

FIGS. 15A to 15F are cross sectional views which illustrate a process of manufacturing the photoelectric conversion device according to the present invention.

First, the photoelectric conversion device according to this embodiment will now be described with reference to the manufacturing process shown in FIGS. 15A to 15F.

First, a scanning IC substrate comprising a MOS transistor is manufactured by an ordinary MOS processing technology (FIG. 12A).

Then, the surface of the substrate is flattened for the purpose of stacking the photoelectric conversion device in such a manner that a taking-out electrode 608 is formed in process (FIG. 12A), and a $SiO_2$ film 609 is deposited by 8000 Å. Then, an ordinary photoresist is spin-coated so that the surface is flattened before it is etched back by a RIE so as to cause the top portion of the electrode 608 to appear while maintaining the flatness (FIG. 12B).

Then, Cr is deposited to a thickness of 2000 Å by an ordinary sputtering method, and a desired shape is formed by an ordinary photolithographic process, so that a pixel electrode 610 is formed (FIG. 12C). Then, the sample is placed in a capacitance-coupled plasma CVD apparatus in which a $SiH_4$ gas and a $B_2H_6$ gas diluted to 10% by a $H_2$ gas are introduced into the aforesaid apparatus by quantities of 60 SCCM and 20 SCCM respectively so as to perform RF discharge for about 5.5 minutes while making the total gas pressure to be 0.2 Torr. As a result, an electron blocking layer 611 which is a p-type high density layer made of a-Si:H and having a thickness of about 1000 Å is deposited. The temperature of the substrate is 300° C. and the density of the discharge power is about 0.2 W/cm² at this time.

Then, in the aforesaid CVD apparatus, the $SiH_4$ gas is continuously changed from 60 SCCM to 6 SCCM and a $GeH_4$ gas is continuously changed from 0 SCCM to 54 SCCM in the aforesaid CVD apparatus, and an RF discharge is performed for 2.8 minutes under conditions that the temperature of the substrate is 300° C., the total gas pressure is 0.2 Torr, the RF power density is about 0.5 W/cm², so that an inclined band gap layer 612a made of a-SiGe:H is deposited to have a thickness of about 500 Å (a deposition process 1).

Then, in the aforesaid CVD apparatus, a 6 SCCM $SiH_4$ gas, a 54 SCCM $GeH_4$ gas and a 6 SCCM $PH_3$ gas diluted to 10% by a $H_2$ gas are introduced into the aforesaid CVD apparatus and RF discharge is performed for 34 seconds under conditions that the temperature of the substrate is 300° C., the total gas pressure is 0.2 Torr, the RF power density is about 0.5 W/cm², so that a n-type layer 612b made of a-SiGe:H is deposited to have a thickness of about 100 Å (a deposition process 2).

Then, in the aforesaid CVD apparatus, the flow rate of the $SiH_4$ gas is gradually changed from 24 SCCM to 60 SCCM and the flow rate of the $NH_3$ gas is gradually changed from 36 SCCM to 0 SCCM, and RF discharge is performed for about 4.7 minutes under conditions that the temperature of the substrate is 300° C., the total gas pressure is 0.3 Torr, the RF power density is about 0.2 W/cm², so that an inclined band gap layer 612c made of a-SiN:H is deposited to have a thickness of about 500 Å (a deposition process 3).

Then, the aforesaid deposition processes 1 to 3 are repeated two times, so that three inclined band gap layers are formed.

Then, in the aforesaid CVD apparatus, the flow rate of the $SiH_4$ gas is set to 30 SCCM and that of the $H_2$ gas is set to 30 SCCM, and RF discharge is performed for about 75 minutes under conditions that the temperature of the substrate 300° C., the total gas pressure is 0.3 Torr, the RF power density is about 0.2 W/cm², so that a light absorbing layer 613 having a thickness of about 8000 Å is formed. Then, a 24 SCCM $SiH_4$ gas, a 20 SCCM $PH_3$ gas diluted to 10% by a $H_2$ gas and a 36 SCCM $NH_3$ gas are introduced, and discharge was performed for about 4.7 minutes under the same conditions as those in the deposition process 3, so that a blocking layer 614 having a thickness of about 500 Å is formed (FIG. 12D).

Then, the semiconductor layers 611 to 614 are patterned to be a desired shape and the device was isolated (FIG. 12E).

Then, the sample is placed in another capacity-coupled plasma CVD apparatus, 10 SCCM of a $SiH_4$ gas diluted to 10% by a $H_2$ gas and 100 SCCM 99.99% $NH_3$ gas are introduced, and an RF discharge is performed for about 60 minutes under conditions that the temperature of the substrate is 300° C., the total gas pressure is 0.4 Torr, the RF power density is about 0.01 W/cm², so that a protection layer 615 having a thickness of about 3000 Å and made of $SiH_x$ film is formed. Then, a through hole is formed in the protection layer 615, and an ITO film 616 having a thickness of 700 Å is formed by a sputtering method, so that a photoelectric conversion device is manufactured (FIG. 12F).

Figure 16A:
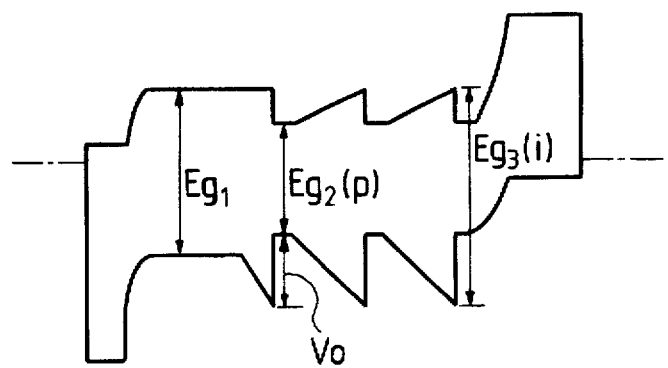
FIGS. 16A to 16B illustrate a band of the photoelectric conversion device according to a comparative example, where
Figure 16B:
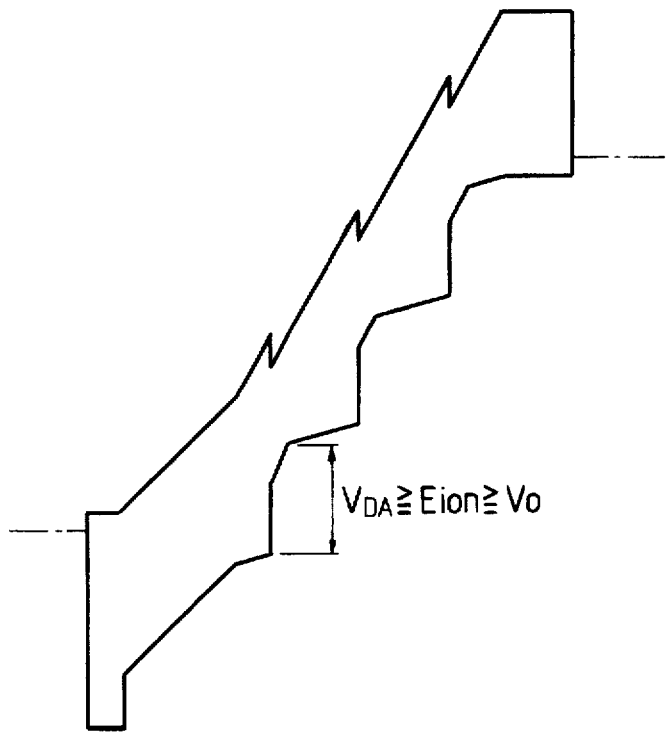

Although the photoelectric conversion device according to the present invention is structured similarly to the comparative example shown in FIGS. 16A to 16C in such a manner that the three-step inclined band gap layer forms a hetero junction, the difference lies in that the structure of the comparative example shown in the energy band view shown in FIG. 16A and arranged in such a manner that the $Eg_2$ portion is made of a p-type structure and the $Eg_3$ portion is made of an i-type structure is replaced by a structure arranged in such a manner that the $Eg_2$ portion is made of a n-type structure and the Eg$_3$ portion is made of an i-type structure. The aforesaid structure is a characteristic of this embodiment.

Figure 17:
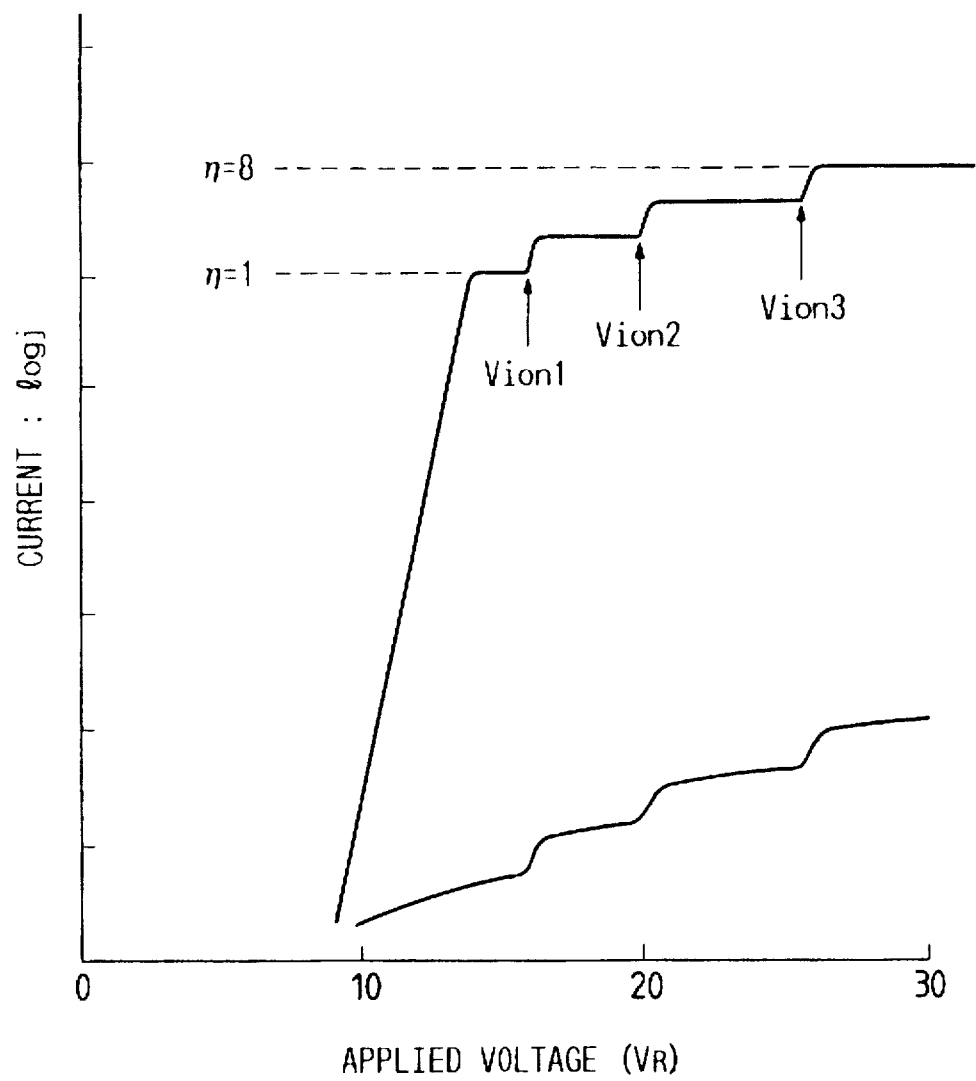
FIG. 17 is a graph which illustrates characteristics of the photoelectric conversion device shown in FIG. 7A between electric currents and voltages.

FIG. 17 is a graph which illustrates the characteristics between electric currents and voltages of the APD, the APD having the three-step carrier multiplication portion as shown in FIGS. 7A to 7C. As shown in FIG. 17, an electric current corresponding to a quantum efficiency 2 starts passing at a position in the neighborhood exceeding ionization commencement voltage V$_{ion1}$, and then an electric current corresponding to quantum efficiencies 4 and 8 starts gradually passing at positions in the neighborhood of V$_{ion2}$ and V$_{ion3}$.

Figure 18:
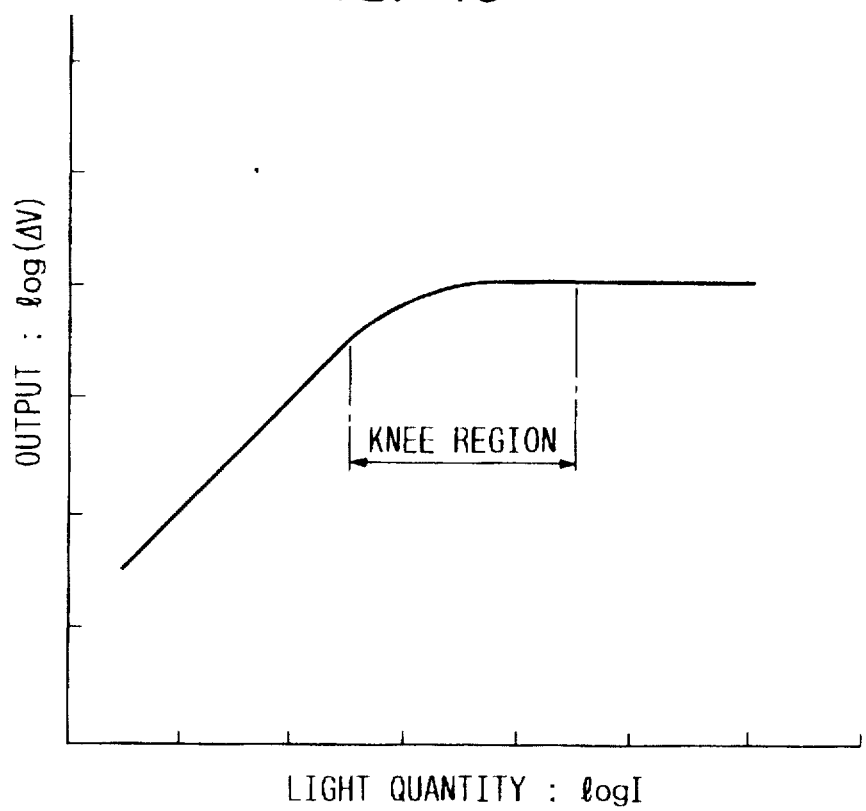
FIG. 18 illustrates the photoelectric conversion characteristics realized when an operation of storing a charge into the photoelectric conversion device shown in FIG. 7A.

FIG. 18 illustrates the relationship between inputs and outputs realized when the storage operation is performed by applying a bias voltage higher than V$_{ion3}$ to the device according to this embodiment. The output is, as shown in FIG. 18, changed in this way that its inclination with respect to the input is changed if it exceeds a certain light quantity to become moderate by a degree corresponding to the step of the current-voltage characteristics until it is saturated. An output saturation characteristics of the aforesaid type can be approximately assumed to be a so-called Knee characteristics with which the dynamic range can be widened.

That is, it can be understood that the dynamic range can be widened by a degree (about 8 times according to this embodiment) which equivalents to the multiplication ratio in comparison to the case where the output has no Knee characteristics by superposing the boundary of the subject light quantity region on a point at which the saturation characteristics are commenced.

Then, a method of driving the photoelectric conversion device according to this embodiment and thus manufactured with a minimum voltage level will now be described.

As described above, the bias voltage V$_V$ to be applied to the two ends of the light absorbing layer and the carrier multiplication layer of the photoelectric conversion device must meet the following relationship:

$$V_V \geq \frac{d_P + d_A}{d_A} \cdot n \cdot E_{V\,OFF} + \quad (23)$$

$$n \cdot (n+1) \cdot \frac{d_{GRD\,int}}{d_{EG2\,dop}} \cdot (E_{g2} - E_{V\,OFF})$$

where

E$_{V\,OFF}$: energy step of the valence electron band in the hetero junction portion in which the forbidden band is discontinuously changed from the maximum value to the minimum value d$_P$: thickness of light absorbing layer d$_A$: thickness of carrier multiplication layer d$_{GRD\,int}$: thickness of one inclined band gap layer d$_{EG2\,dop}$: thickness of one layer having the maximum forbidden band to which impurities are added to a high density n: number of herero junction portions of a layer having the maximum forbidden band and a layer having the minimum forbidden band In the case of this embodiment, the aforesaid parameters are as follows assuming that Eg$_2$=1.2, Eg$_3$=2.5, E$_{C\,OFF}$=0.2 and E$_{V\,OFF}$=1.1, d$_P$=8000 Å d$_A$=3000 Å d$_{GRD\,int}$=1000 Å d$_{EG2\,dop}$=100 Å n=3

Substituting the aforesaid parameters to aforesaid Equation (23), the following result is obtained:

$$V_V \geq \frac{8000 + 3000}{3000} \times 3 \times 1.1 + 3 \times (3+1) \times \frac{1000}{100} \times$$

$$(1.2 - 1.1) = 24.1$$

Therefore, the aforesaid equation can be met if 30 V is applied as the bias voltage (video voltage).

When a video voltage V$_V$ of 30V was added to the photoelectric conversion device thus manufactured while making the voltage level at the light absorbing layer to be lower than that at the carrier multiplication layer, the Knee characteristics took place in the output in the neighborhood of a surface illuminance of the photoelectric conversion device of about 300 lux, and it was saturated at about 2000 lux, and a dynamic range of about 95 dB was obtained.

A sensitivity of 8 times the sensitivity, which was realized when an ordinary PN, PIN, or Schottkey device was used, was obtained. Thus, excellent sensitivity and wide dynamic range were realized.

As described above, according to the present invention, the Knee characteristics can be attained in the charge storage operation, the dynamic range can be widened, and excellent sensitivity can be realized since the photoelectric conversion device, on which the APD arranged to utilize the electron multiplication and having a structure formed by repeating the inclined band gap is mounted, is arranged in such a manner that at least a portion having the minimum forbidden width Eg$_2$ of the hetero junction portion of the minimum forbidden band Eg$_2$ portion of the inclined band gap layer and the maximum forbidden band Eg$_3$ portion of the other inclined band gap layer is made to be a high density n-type semiconductor layer.

Furthermore, the photoelectric conversion device can be driven by a voltage level lower than that required in the conventional example by making the bias voltage V$_V$ to be added to the device to be lower in the light absorbing layer than that to be applied to the carrier multiplication layer while meeting the conditional equation.

(EXAMPLE 3)

This embodiment relates to an apparatus having a cross sectional structure formed as shown in FIG. 8A, an energy band profile realized when no bias is applied to the photoelectric conversion device portion and shown in FIG. 8B and an energy band profile realized when a bias required to cause the carrier multiplication to take place and shown in FIG. 8C.

FIGS. 19A to 19F are cross sectional views which illustrates a process of manufacturing the photoelectric conversion device according to the present invention. First, the photoelectric conversion device according to this embodiment will now be described with reference to the manufacturing process shown in FIGS. 12A to 12F.

Figure 19A:
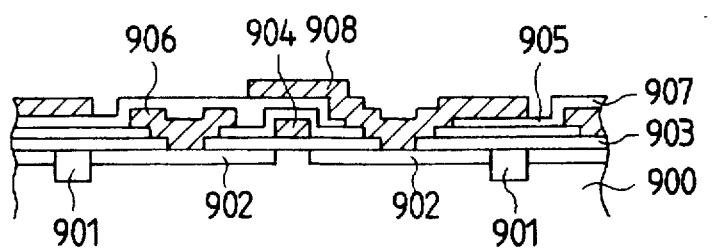
FIGS. 19A to 19F are schematic views which illustrate a process for manufacturing a device according to example 3.

First, a scanning IC substrate comprising a MOS transistor is manufactured by ordinary MOS processing technology (FIG. 19A).

Figure 19B:
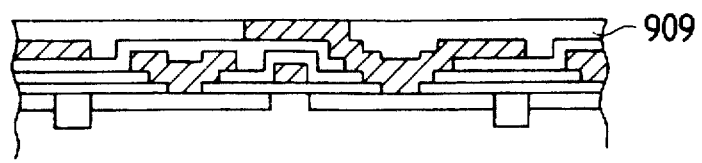

Then, the surface of the substrate is flattened for the purpose of stacking the photoelectric conversion device in such a manner that a taking-out electrode 908 is formed in process (FIG. 19A), a SiO$_2$ film 909 is deposited by 8000 Å. Then, an ordinary photoresist is spin-coated so that the surface is flattened before it is etched back by a RIE so as to cause the top portion of the electrode 908 to appear while maintaining the flatness (FIG. 19B).

Figure 19C:
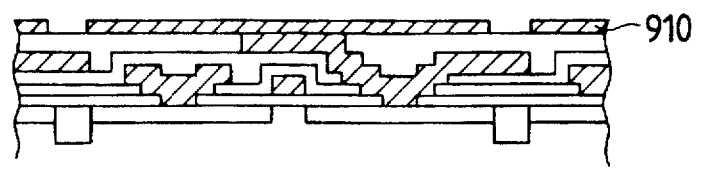

Then, Cr is deposited to a thickness of 2000 Å by an ordinary sputtering method, and a desired shape is formed by an ordinary photolithographic process, so that a pixel electrode 910 is formed (FIG. 19C). Then, the sample is placed in a capacity-coupled plasma CVD apparatus in which a 65 CCM $SiH_4$ gas, a 54 SCCM $GeH_4$ gas, and 20 SCCM $PH_3$ gas diluted to 10% by a $H_2$ gas are introduced into the aforesaid apparatus so as to perform RF discharge for about 5.5 minutes while making the total gas pressure to be 0.2 Torr. As a result, a hole blocking layer 911 which is an n-type high density layer made of a-SiGe:H and having a thickness of about 1000 Å is deposited. The temperature of the substrate is 300° C. and the density of the discharge power is about 0.2 $W/cm^2$ at this time.

Then, in the aforesaid CVD apparatus, the $SiH_4$ gas is continuously changed from 60 SCCM to 6 SCCM and a $GeH_4$ gas is continuously changed from 0 SCCM to 54 SCCM in the aforesaid CVD apparatus, and an RF discharge is performed for 2.8 minutes under conditions that the temperature of the substrate is 300° C., the total gas pressure is 0.2 Torr, the RF power density is about 0.5 $W/cm^2$, so that an inclined band gap layer 912a made of a-SiGe:H is deposited to have a thickness of about 500 Å (a deposition process 1).

Then, in the aforesaid CVD apparatus, a 24 SCCM $SiH_4$ gas, a 36 SCCM $CH_4$ gas, and a 6 SCCM $B_2H_6$ gas diluted to 10% by a $H_2$ gas are introduced into the aforesaid CVD apparatus and RF discharge is performed for 56 seconds under conditions that the temperature of the substrate is 300° C., the total gas pressure is 0.3 Torr, the RF power density is about 0.2 $W/cm^2$, so that a p-type layer 912b made of a-SiC:H is deposited to have a thickness of about 100 Å (a deposition process 2).

Then, in the aforesaid CVD apparatus, the flow rate of the $SiH_4$ gas is gradually changed from 24 SCCM to 60 SCCM and the flow rate of the $CH_4$ gas is gradually changed from 36 SCCM to 0 SCCM, and RF discharge is performed for about 4.7 minutes seconds under conditions that the temperature of the substrate is 300° C., the total gas pressure is 0.3 Torr, the RF power density is about 0.2 $W/cm^2$, so that an inclined band gap layer 912c made of a-SiC:H is deposited to have a thickness of about 500 Å (a deposition process 3).

Then, the aforesaid deposition processes 1 to 3 are repeated two times, so that three inclined band gap layers are formed.

Figure 19D:
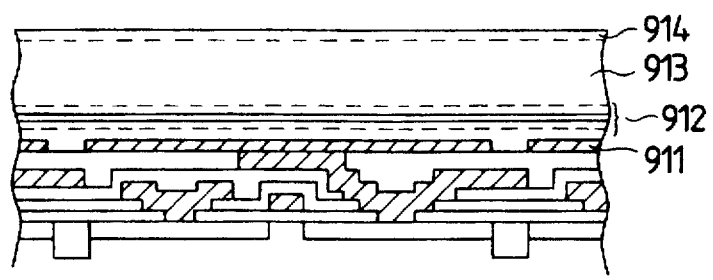

Then, in the aforesaid CVD apparatus, the flow rate of the $SiH_4$ gas is set to 30 SCCM and that of the $H_2$ gas is set to 30 SCCM, and RF discharge is performed for about 75 minutes under conditions that the temperature of the substrate is 300° C., the total gas pressure is 0.3 Torr, the RF power density is about 0.2 $W/cm^2$, so that a light absorbing layer 913 having a thickness of about 8000 Å is formed. Then, a 24 SCCM $SiH_4$ gas, a 20 SCCM $B_2H_6$ gas diluted to 10% by a $H_2$ gas and a 36 SCCM $CH_4$ gas are introduced, and discharge was performed for about 5 minutes under the same conditions as those in the deposition process 2, so that a blocking layer 914 having a thickness of about 500 Å is formed (FIG. 19D).

Figure 19E:
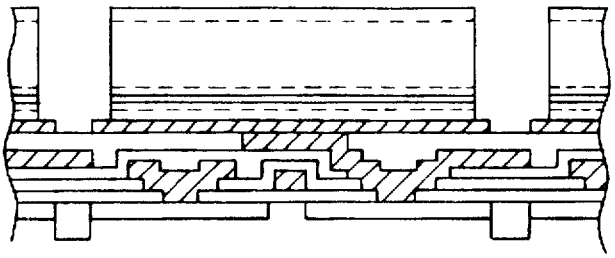

Then, the semiconductor layers 911 to 914 are patterned to be a desired shape and the device was isolated (FIG. 19E).

Figure 19F:
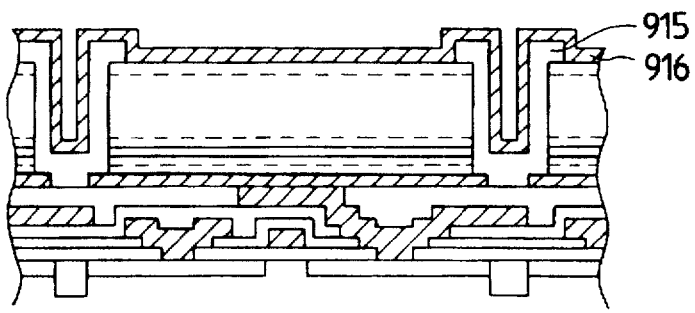

Then, the sample is placed in another capacity-coupled plasma CVD apparatus, 10 SCCM of a $SiH_4$ gas diluted to 10% by a $H_2$ gas and 100 SCCM 99.99% $NH_3$ gas are introduced, and an RF discharge is performed for about 60 minutes under conditions that the temperature of the substrate is 300° C., the total gas pressure is 0.4 Torr, the RF power density is about 0.01 $W/cm^2$, so that a protection layer 915 having a thickness of about 3000 Å and made of $SiH_x$ film is formed. Then, a through hole is formed in the protection layer 915, and an ITO film 916 having a thickness of 700 Å is formed by a sputtering method, so that a photoelectric conversion device is manufactured (FIG. 19F).

In accordance with the aforesaid sequential process, the photoelectric conversion device according to this embodiment is manufactured.

In order to perform the driving method according to the present invention, the following relation equation for obtaining the bias $V_V$ to be applied to the aforesaid photoelectric conversion device is employed:

$$V_V = V_{ionmax} q \cdot k \cdot I_{Knee} \cdot A \cdot t_s / (C_{PD} + C_D) \tag{24}$$

where $V_{ionmax}$: voltage at which multiplication of current is saturated q: unit charge quantity k: multiplication constant $I_{Knee}$: light quantity with which Knee characteristics take place A: area of one pixel $t_s$: charge storage time $C_{PD}$: capacity of photoelectric conversion device portion $C_D$: capacity stored in switch device The following parameters according to this embodiment were substituted into the aforesaid equation:

$$A = 10^2 \, \mu m = 10^{-6} \, cm^2, \, I_{Knee} = 3 \times 10^{14} \, cm^{-2} \cdot sec^{-1},$$
$$k = 8, \, t_s = 1.3 \times 10^{-4} \, sec, \, V_{ionmax} = 24,$$
$$C_{pd} = \epsilon A/d (\epsilon = 12 \times 8.85 \times 10^{-14} \, F \cdot cm^{-1},$$
$$d = 10^{-4} \, cm), \, C_D \ll C_{PD}, \, resulting,$$

$$V_V = V_{isomax} + \frac{q \cdot k \cdot I_{Knee} \cdot A \cdot t_s}{C_{PD} + C_D}$$

$$\cong V_{isomax} + \frac{q \cdot k \cdot I_{Knee} \cdot t_s}{\epsilon/d}$$

$$= V_{isomax} + \frac{q \cdot k \cdot d \cdot I_{Knee} \cdot t_s}{\epsilon}$$

$$= 24 + \frac{1.6 \times 10^{-19} \times 1.3 \times 10^{-4} \times 3 \times 10^{14} \times 10^{-3}}{8.85 \times 10^{-14} \times 12}$$

$$\cong 24 + 6 = 30$$

When a video voltage $V_V$ of 30 V was, as the applied bias voltage (video voltage), added to the photoelectric conversion device thus manufactured while making the voltage level at the light absorbing layer to be lower than that at the carrier multiplication layer, the Knee characteristics took place in the output in the neighborhood of a surface illuminance of the photoelectric conversion device of about 300 lux, and it was saturated at about 2000 lux, and a dynamic range of about 95 dB was obtained.

A sensitivity of 8 times the sensitivity, which was realized when an ordinary PN, PIN, or Schottkey device was used, was obtained. Thus, excellent sensitivity and wide dynamic range were realized.

As described above, according to the present invention, the method of driving the photoelectric conversion device having a repeated structure of inclined band gap layers is arranged in such a manner that voltage $V_V$ which meets the following relationship is applied to the aforesaid photoelectric conversion device:

$$V_V = V_{ionmax} + q \cdot k \cdot I_{Knee} \cdot A \cdot t_s / (C_{PD} + C_D) \tag{25}$$

so that an effect is obtained in that a large dynamic range can be maintained while preventing deterioration of the S/N ratio.

Figure 20:
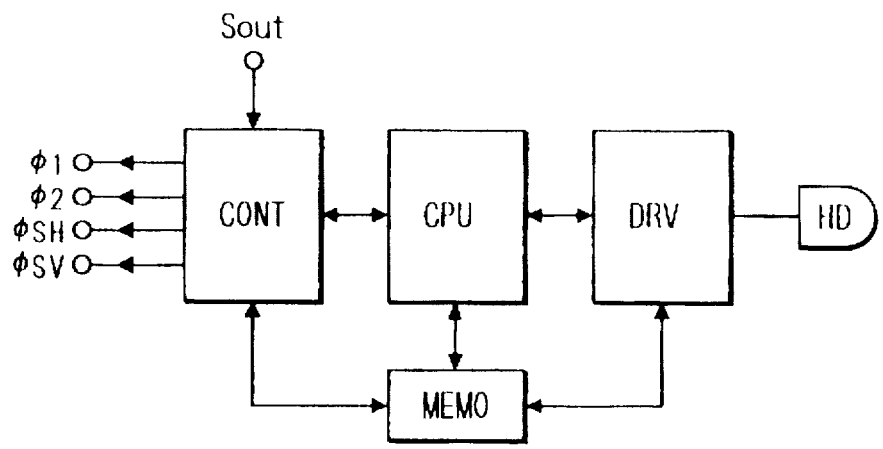
FIG. 20 is a block diagram which illustrates an information signal processing apparatus having the photoelectric conversion device according to the present invention.

FIG. 20 is a block diagram which illustrates a control system of an information signal processing system having the photoelectric conversion device according to the present invention and shown in FIG. 11. A control circuit Cont transmits pulses $\phi 1$, $\phi 2$, $\phi SH$ and $\phi SV$ and receives a signal $S_{OUT}$. The image signal $S_{OUT}$ is A/D-converted, and is stored in a memory MEMO. The aforesaid signal is read from the memory MEMO if necessary and is recorded on a recording medium by using a recording head HD. Symbol DRV represents a drive circuit for driving the recording head.

What is claimed is:

1. A photoelectric conversion device integratedly comprising:

a light absorbing layer having an energy bandgap width $Eg_1$ arranged between an upper and a lower carrier injection preventing layer; and a plurality of inclined energy bandgap layers, located below said light absorbing layer and above said lower carrier injection preventing layer, wherein electrons are multiplied, in which an energy bandgap width increases gradually from a minimum energy bandgap width $Eg_2$, into a maximum energy bandgap width $Eg_3$, wherein $Eg_3>Eg_2$, and wherein said plurality of said inclined energy bandgap layers are adjacent to one another, and a heterojunction in which an energy step difference is greater at a conduction band and is less at a valence band is formed between a section of the maximum energy bandgap width $Eg_3$ of one of said inclined energy bandgap layers and an adjacent section of the minimum energy bandgap width $Eg_2$ of another of said inclined energy bandgap layers adjacent to said one inclined energy bandgap layer, and wherein at least the section of the minimum energy bandgap width $Eg_2$ of said another inclined energy bandgap layer in an area of the heterojunction is made of a high impurity concentration p-type semiconductor.

2. A device according to claim 1, wherein the energy bandgap width $Eg_1$ of said light absorbing layer gradually increases to an energy bandgap width $Eg_3$.

3. A photoelectric conversion device according to claim 1, wherein the section of the maximum energy bandgap width $Eg_3$ of one of said inclined energy bandgap layers is formed from amorphous silicon carbide, and the section of the minimum energy bandgap width $Eg_2$ of another of said inclined energy bandgap layers is formed from amorphous silicon germanium.

4. A photoelectric conversion device integratedly comprising:

a light absorbing layer having an energy bandgap width $Eg_1$ arranged between an upper and a lower carrier injection preventing layer; and a plurality of inclined energy bandgap layers, located below said light absorbing layer and above said lower carrier injection preventing layer, wherein holes are multiplied, in which an energy bandgap width increases gradually from a minimum energy bandgap width $Eg_2$ into a maximum energy bandgap width $Eg_3$, wherein $Eg_3>Eg_2$, and wherein said plurality of said inclined energy bandgap layers are adjacent to one another, and a heterojunction in which energy step difference is greater at a valence band and is less at a conduction band is formed between a section of the maximum energy bandgap width $Eg_3$ of one of said inclined energy bandgap layers and an adjacent section of the minimum energy bandgap width $Eg_2$ of another of said inclined energy bandgap layers adjacent to said one inclined energy bandgap layer, and wherein at least the section of the minimum energy bandgap width $Eg_2$ of said another inclined energy bandgap layer in an area of the heterojunction is made of a high impurity concentration n-type semiconductor.

5. A device according to claim 4, wherein the energy bandgap width $Eg_1$, of said light absorbing layer gradually increases to an energy bandgap width $Eg_3$.

6. A photoelectric conversion device according to claim 4, wherein the section of the maximum energy bandgap width $Eg_3$ of one of said inclined energy bandgap layers is formed from amorphous silicon nitride, and the section of the minimum energy bandgap $Eg_2$ of another of said inclined energy bandgap layers is formed from amorphous silicon germanium.

7. A photoelectric conversion device integratedly comprising:

a light absorbing layer having a predetermined energy bandgap width $Eg_1$ arranged between a lower and an upper carrier injection preventing layer; and a carrier multiplication portion, located below said light absorbing layer and above said lower carrier injection prevention layer, wherein electrons are multiplied, including at least one inclined energy bandgap region, said inclined energy bandgap region comprising a first sublayer in which an energy bandgap width increases gradually from a predetermined width $Eg_4$ into a maximum width $Eg_3$, and a second sublayer, adjacent to and below said first sublayer, in which an energy bandgap width increases gradually from a minimum width $Eg_2$ into the predetermined width $Eg_4$ wherein $Eg_2<Eg_4<Eg_3$, and wherein a heterojunction in which an energy step difference is greater at a conduction band and is less at a valence band is formed between a section of the maximum energy bandgap width $Eg_3$ of said first sublayer and a section of the minimum energy bandgap width $Eg_2$ of said second sublayer adjacent to the section of the maximum energy bandgap width $Eg_3$, and wherein at least the section of the minimum energy bandgap width $Eg_2$ of said second sublayer in an area of the heterojunction is made of a high impurity concentration p-type semiconductor.

8. A device according to claim 7, wherein the energy bandgap width $Eg_1$ of said light absorbing layer gradually increase to an energy bandgap width $Eg_3$.

9. A photoelectric conversion device according to claim 7, wherein the section of the maximum energy bandgap width $Eg_3$ of said first sublayer is formed from amorphous silicon carbide, and the section of the minimum is formed from amorphous silicon germanium.

10. A photoelectric conversion device according to claim 7, wherein said photoelectric conversion device is driven by a bias voltage $V_V$, applied to two ends of said light absorbing layer and said carrier multiplication portion of said photoelectric conversion device in such a manner that a potential applied to said light absorbing layer is lower than a potential applied to said carrier multiplication layer.

11. A method of driving a photoelectric conversion device according to claim 10, wherein said photoelectric conversion device is driven by said bias voltage $V_V$ applied to two ends of said light absorbing layer and said carrier multiplication portion of said photoelectric conversion device, said bias voltage $V_V$ holding the following relationship:

$$V_V \geq \frac{d_P + d_A}{d_A} \cdot n \cdot E_{C\,OFF} + n \cdot (n+1) \cdot \frac{d_{GRD\,int}}{d_{EG2\,dop}} \cdot (E_{g2} - E_{C\,OFF}) \quad (4)$$

where

- $E_{C\,OFF}$: energy step of the conductive band in the hetero junction portion in which the forbidden band is discontinuously changed from the maximum value to the minimum value
- $d_P$: thickness of light absorbing layer
- $d_A$: thickness of carrier multiplication layer
- $d_{GRD\,int}$: thickness of one inclined band gap layer
- $d_{EG2\,dop}$: thickness of one layer having the maximum forbidden band to which impurities are added to a high density
- n: number of hetero junction portions of a layer having the maximum forbidden band and a layer having the minimum forbidden band.

12. A photoelectric conversion device integratedly comprising:

a light absorbing layer having a predetermined energy bandgap width $Eg_1$ arranged between an upper and a lower carrier injection preventing layer; and a carrier multiplication portion, located below said light absorbing layer and above said lower carrier injection preventing layer, wherein holes are multiplied, including at least one inclined energy bandgap region, said inclined energy bandgap region comprising a first sublayer in which an energy bandgap width increases gradually from a predetermined width $Eg_4$ into a maximum width $Eg_3$, and a second sublayer, adjacent to and below said first sublayer, in which an energy bandgap width increases gradually from a minimum width $Eg_2$ into the predetermined width $Eg_4$, wherein $Eg_2 < Eg_4 < Eg_3$, and wherein a heterojunction of which an energy step difference is greater at a valence band but less at a conduction band is formed between a section of the maximum energy bandgap width $Eg_3$ of said first sublayer and a section of the minimum energy bandgap width $Eg_2$ of said second sublayer adjacent to the section of the maximum energy bandgap width $Eg_3$, wherein at least the section of the minimum energy bandgap width $Eg_2$ of said second sublayer in an area of the heterojunction is made of a high impurity concentration n-type semiconductor.

13. A device according to claim 12, wherein the energy bandgap width $Eg_1$ of said light absorbing layer gradually increases to an energy bandgap width $Eg_3$.

14. A photoelectric conversion device according to claim 12, wherein the section of the maximum energy bandgap width $Eg_3$ of said first sublayer is formed from amorphous silicon nitride, and the section of the minimum energy bandgap $Eg_2$ of said second sublayer is formed from amorphous silicon germanium.

15. A photoelectric conversion device according to claim 12, wherein said photoelectric conversion device is driven by a bias voltage $V_V$ applied to two ends of said light absorbing layer and said carrier multiplication portion of said photoelectric conversion device in such a manner that a potential applied to said light absorbing layer is lower than a potential applied to said carrier multiplication layer.

16. A photoelectric conversion device according to claim 15, wherein said photoelectric conversion device is driven by said bias voltage $V_V$ applied to two ends of said light absorbing layer and said carrier multiplication portion of said photoelectric conversion device, said bias voltage $V_V$ holding the following relationship:

$$V_V \geq \frac{d_P + d_A}{d_A} \cdot n \cdot E_{V\,OFF} + n \cdot (n+1) \cdot \frac{d_{GRD\,int}}{d_{EG2\,dop}} \cdot (E_{g2} - E_{V\,OFF}) \quad (4)$$

where

- $E_{V\,OFF}$: energy step of a valence band in the hetero junction portion in which the forbidden band is discontinuously changed from the maximum value to the minimum value
- $d_P$: thickness of light absorbing layer
- $d_A$: thickness of carrier multiplication layer
- $d_{GRD\,int}$: thickness of one inclined band gap layer
- $d_{EG2\,dop}$: thickness of one layer having the maximum forbidden band to which impurities are added to a high density
- n: number of hetero junction portions of a layer having the maximum forbidden band and a layer having the minimum forbidden band.

\* \* \* \* \*

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

ON COVER PAGE AT [57], ABSTRACT

Line 5, "band width" should read --bandwidth--;
Line 7, "band gap" (both occurrences) should read --bandgap--;
Line 8, "band width" should read --bandwidth--;
Line 9, "band width" should read --bandwidth--;
Line 10, "hetero junction" should read --heterojunction--;
Line 11, "band width" should read --bandwidth--;
Line 13, "band width" should read --bandwidth--;
Line 14, "band widths" should read --bandwidths-- and "band" should read --band---;
Line 16, "hetero junction" should read --heterojunction--;
Line 18, "band width" should read --bandwidth--; and "hetero" should read --hetero---.

COLUMN 1

Line 42, "eliminates" should read --eliminate--;
Line 53, "devices" (both occurrences) should read --devices,--;
Line 62, "sate" should read --state--.

COLUMN 2

Line 45, "layers" should read --layer--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

COLUMN 4

Line 13, "the" (second occurrence) should be deleted;
Line 21, "provide" should read --to provide--.

COLUMN 9

Line 17, "drive" should read --driven--.

COLUMN 10

Line 42, "cross sectional" should read --cross-sectional--;
Line 64, "layer" should read --layer, i.e., a layer doped with impurities,--.

COLUMN 11

Line 30, "$Eg_1$," should read --$Eg_1$--;
Line 64, "cross sectional" should read --cross-sectional--.

COLUMN 12

Line 44, "$Eg_3$" and "$Eg_2$" should read --$Eg_3$-- and --$Eg_2$--;
Line 52, "$eg_2$" should read --$Eg_2$--;
Line 61, "cross sectional" should read --cross-sectional--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

COLUMN 13

Line 29, "equivalents" should read --is equivalent--.

COLUMN 14

Line 12, "starts" should read --start.

COLUMN 15

Line 10, "takes" should read --take--;
Line 33, "Also" should read --Also,--;
Line 62, "meant" should read --meant as--.

COLUMN 16

Line  5, "ta" should read --Tl--;
Line 25, "cross" should read --cross---;
Line 32, "cross sectional" should read --cross-sectional--;
Line 33, "trates" should read --trate--;
Line 66, "$GeH_4$," should read --$GeH_4$--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

COLUMN 17

Line 4, "cap" should read --gap--;
Line 7, "6 SCCM $B_2H_6$" should read --6 SCCM $B_2H_6$--;
Line 19, "seconds" should be deleted and "Conditions" should read --conditions--;
Line 43, "capacity-coupled" should read --capacitance-coupled--;
Line 50, "$SH_x$ should read --$SiH_x$--.

COLUMN 18

Line 14, "equivalents" should read --is equivalent--.

COLUMN 19

Line 4, "shot key" should read --Schottkey--;
Line 27, "cross" should read --cross---;
Line 34, "cross sectional" should read --cross-sectional--.

COLUMN 20

Line 45, "capacity-coupled" should read --capacitance-coupled--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

COLUMN 21

Line 26, "equivalents" should read --is equivalent--;
Line 57, "herero" should read --hetero--.

COLUMN 22

Line 43, "cross" should read --cross---;
Line 50, "cross sectional" should read --cross-sectional--.

COLUMN 23

Line 5, "capacity-coupled" should read
  --capacitance-coupled--;
Line 28, "seconds" should be deleted.
Line 62, "capacity-coupled" should read
  --capacitance-coupled--;

COLUMN 24

Line 15, "$V_v = V_{ionmax} q \cdot k \cdot I_{knee} \cdot A \cdot t_s / (C_{PD} + C_D)$ (24)" should read
  --"$V_v = V_{ionmax} + q \cdot k \cdot I_{knee} \cdot A \cdot t_s / (C_{PD} + C_D)$ (24);
Lines 36-42, "$V_{isomax}$" (all three occurrences) should read
  --$V_{ionmax}$--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

COLUMN 25

Line 7, "Cont" should read --CONT--

COLUMN 26

Line 11, "$Eg_1$," should read --$Eg_1$--;
Line 51, "increase" should read --increases--;

Line 59, "$V_v$," should read --$V_v$--;
Line 64, "method of driving a" should be deleted.

COLUMN 27

Line 7, "hetero" should read --hetero---;
Line 17, "hetero junction" should read --heterojunction--.

UNITED STATES PATENT AND TRADEMARK OFFICE
CERTIFICATE OF CORRECTION

PATENT NO. : 5,767,560

DATED : June 16, 1998

INVENTOR(S): IHACHIRO GOFUKU

It is certified that error appears in the above-identified patent and that said Letters Patent is hereby corrected as shown below:

<u>COLUMN 28</u>

Line 30, "hetero" should read --hetero---;
Line 37, "band gap" should read --bandgap--;
Line 42, "hetero junction" should read --heterojunction--.

Signed and Sealed this

Eighth Day of June, 1999

*Attest:*

Q. TODD DICKINSON

*Attesting Officer*     *Acting Commissioner of Patents and Trademarks*